United States Patent
Yu et al.

(10) Patent No.: US 11,784,255 B2
(45) Date of Patent: Oct. 10, 2023

(54) SEMICONDUCTOR DEVICES WITH BENT PORTIONS

(71) Applicant: Samsung Electronics Co., Ltd., Suwon-si (KR)

(72) Inventors: Hyun-Kwan Yu, Suwon-si (KR); Sung-Min Kim, Incheon (KR); Dong-Suk Shin, Yongin-si (KR); Seung-Hun Lee, Hwaseong-si (KR); Dong-Won Kim, Seongnam-si (KR)

(73) Assignee: Samsung Electronics Co., Ltd.

( * ) Notice: Subject to any disclaimer, the term of this patent is extended or adjusted under 35 U.S.C. 154(b) by 198 days.

(21) Appl. No.: 17/119,507

(22) Filed: Dec. 11, 2020

(65) Prior Publication Data

US 2021/0119036 A1    Apr. 22, 2021

Related U.S. Application Data

(63) Continuation of application No. 16/045,305, filed on Jul. 25, 2018, now abandoned.

(30) Foreign Application Priority Data

Sep. 12, 2017 (KR) .................. 10-2017-0116803

(51) Int. Cl.
*H01L 29/06* (2006.01)
*H01L 29/78* (2006.01)
(Continued)

(52) U.S. Cl.
CPC .... *H01L 29/785* (2013.01); *H01L 21/823431* (2013.01); *H01L 27/0886* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 5,241,204 A | 8/1993 | Kayama |
| 6,867,460 B1 | 3/2005 | Anderson et al. |

(Continued)

FOREIGN PATENT DOCUMENTS

| CN | 101086994 A | 12/2007 |
| CN | 101989456 A | 11/2012 |

(Continued)

OTHER PUBLICATIONS

Indian Office Action for corresponding Indian Application No. 20183033930 (7 pages) (dated Aug. 29, 2020).
(Continued)

*Primary Examiner* — Matthew C Landau
*Assistant Examiner* — Dmitriy Yemelyanov
(74) *Attorney, Agent, or Firm* — Myers Bigel, P.A.

(57) ABSTRACT

A semiconductor device may include a first active fin, a second active fin and a gate structure. The first active fin may extend in a first direction on a substrate and may include a first straight line extension portion, a second straight line extension portion, and a bent portion between the first and second straight line extension portions. The second active fin may extend in the first direction on the substrate. The gate structure may extend in a second direction perpendicular to the first direction on the substrate. The gate structure may cross one of the first and second straight line extension portions of the first active fin and may cross the second active fin.

20 Claims, 17 Drawing Sheets

(51) Int. Cl.

| | | |
|---|---|---|
| *H01L 29/66* | (2006.01) | |
| *H01L 27/088* | (2006.01) | |
| *H01L 21/8234* | (2006.01) | |
| *H01L 29/423* | (2006.01) | |
| *H10B 10/00* | (2023.01) | |
| *H01L 21/8238* | (2006.01) | |
| *H01L 21/84* | (2006.01) | |
| *H01L 27/12* | (2006.01) | |
| *H01L 27/092* | (2006.01) | |

(52) U.S. Cl.
CPC .... *H01L 29/0642* (2013.01); *H01L 29/42372* (2013.01); *H01L 29/66545* (2013.01); *H01L 29/66795* (2013.01); *H10B 10/12* (2023.02); *H01L 21/823821* (2013.01); *H01L 21/845* (2013.01); *H01L 27/0924* (2013.01); *H01L 27/1211* (2013.01)

(58) Field of Classification Search
CPC ............. H01L 27/1104; H01L 27/1211; H01L 29/0642; H01L 29/42372; H01L 29/66545; H01L 29/66795; H01L 29/785
See application file for complete search history.

(56) References Cited

U.S. PATENT DOCUMENTS

| | | | |
|---|---|---|---|
| 7,622,765 B2 | 11/2009 | Kim et al. | |
| 7,985,990 B2 | 7/2011 | Parikh et al. | |
| 8,130,529 B2 | 3/2012 | Tanaka | |
| 8,258,572 B2 | 9/2012 | Liaw | |
| 8,314,453 B2 | 11/2012 | Thomas et al. | |
| 8,916,460 B1 | 12/2014 | Kwon et al. | |
| 8,987,831 B2 | 3/2015 | Liaw | |
| 9,012,287 B2 | 4/2015 | Liaw | |
| 9,306,070 B2 | 4/2016 | Baek et al. | |
| 9,331,072 B2 | 5/2016 | Seo et al. | |
| 9,461,143 B2 | 10/2016 | Pethe et al. | |
| 9,502,532 B2 | 11/2016 | Park et al. | |
| 9,698,267 B2 | 7/2017 | Song et al. | |
| 9,899,526 B2 | 2/2018 | Chiu et al. | |
| 10,964,801 B2 | 3/2021 | Li et al. | |
| 2004/0212018 A1 | 10/2004 | Shino | |
| 2007/0171700 A1 | 7/2007 | Burnett et al. | |
| 2008/0308880 A1 | 12/2008 | Inaba | |
| 2010/0072553 A1 | 3/2010 | Xu et al. | |
| 2010/0308419 A1 | 12/2010 | Houston et al. | |
| 2011/0133285 A1* | 6/2011 | Liaw ................ | H01L 29/41791 257/E27.098 |
| 2011/0195564 A1 | 8/2011 | Liaw et al. | |
| 2013/0181297 A1* | 7/2013 | Liaw ................ | H01L 27/0886 257/E27.099 |
| 2015/0008526 A1 | 1/2015 | Yasuda et al. | |
| 2016/0099248 A1 | 4/2016 | Wu | |
| 2016/0133632 A1* | 5/2016 | Park ................ | H01L 21/02164 257/369 |
| 2016/0204264 A1 | 7/2016 | You et al. | |
| 2016/0293748 A1 | 10/2016 | Leobandung et al. | |
| 2017/0179120 A1 | 6/2017 | Cheng et al. | |

FOREIGN PATENT DOCUMENTS

| | | | |
|---|---|---|---|
| CN | 105655336 A | 6/2016 | |
| CN | 107039435 A | 8/2017 | |
| JP | 2006245083 A | 9/2006 | |
| JP | 2007266377 A | 10/2007 | |
| KR | 1020070023458 A | 2/2007 | |
| KR | 1020150089911 A | 8/2015 | |
| KR | 1020160011301 A | 2/2016 | |
| KR | 1020180125034 A | 11/2018 | |
| TW | 201711195 A | 3/2017 | |

OTHER PUBLICATIONS

Search Report and Written Opinion for corresponding Singapore Application No. 10201807506V (dated Jan. 29, 2019).

* cited by examiner

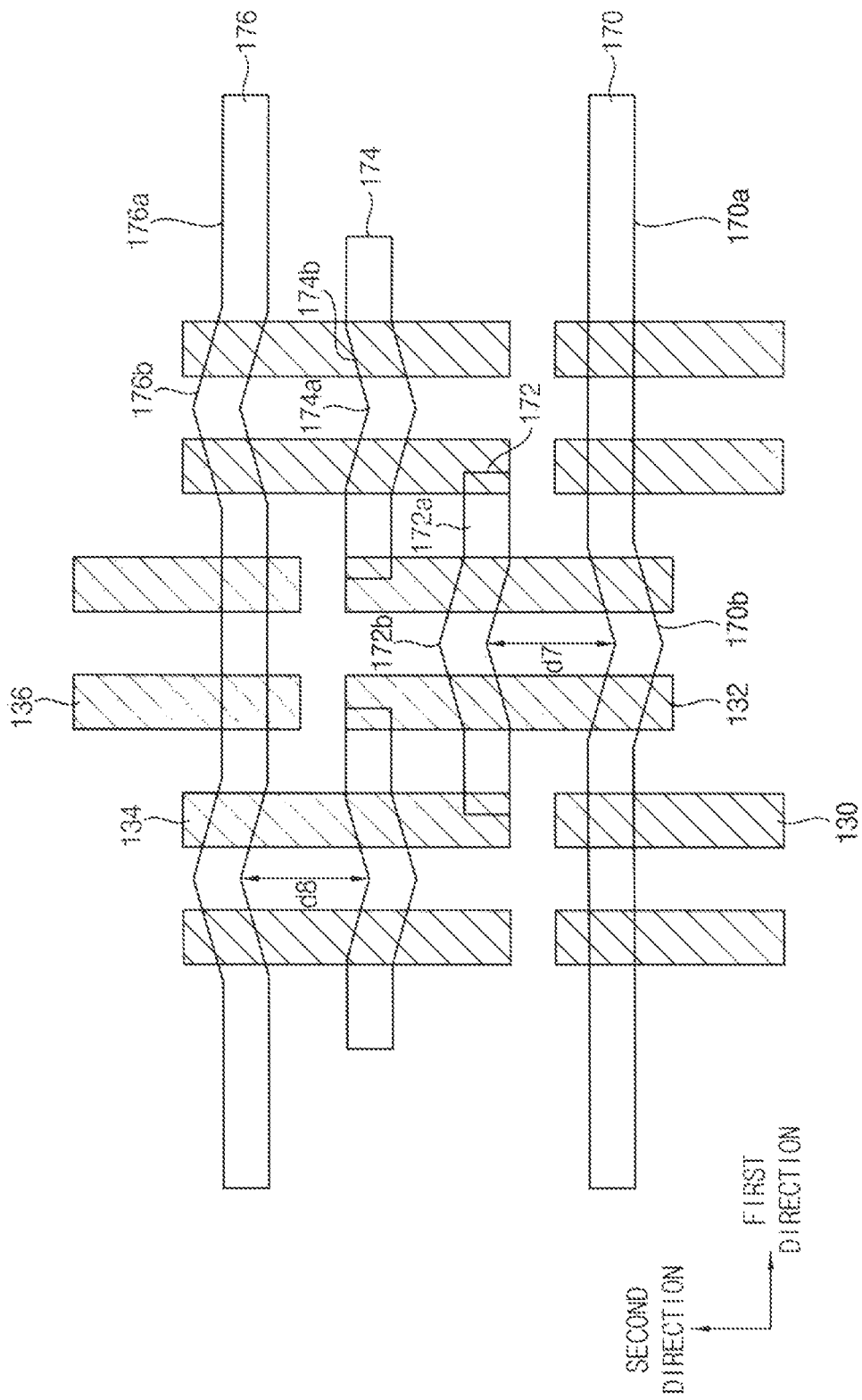

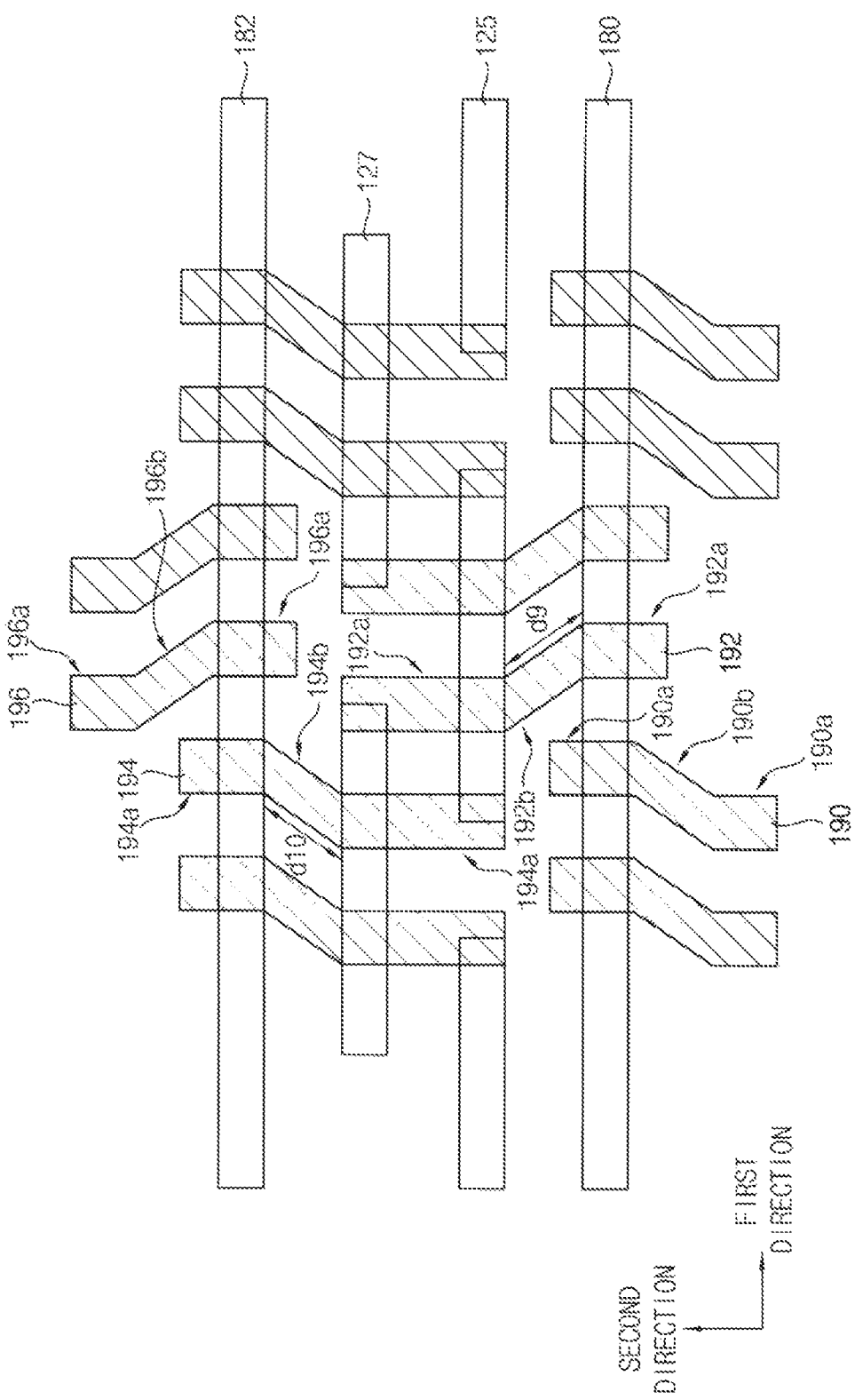

SEMICONDUCTOR DEVICES WITH BENT PORTIONS

CROSS-REFERENCE TO RELATED APPLICATION

This application is a continuation of U.S. patent application Ser. No. 16/045,305, filed Jul. 25, 2018, which claims priority under 35 USC § 119 to Korean Patent Application No. 10-2017-0116803, filed on Sep. 12, 2017 in the Korean Intellectual Property Office (KIPO), the entire contents of which are hereby incorporated herein by reference.

BACKGROUND

Embodiments of the inventive concepts relate to semiconductor devices, and more particularly, to semiconductor devices including fin-field effect transistors (finFETs).

Semiconductor devices including high performance finFETs have been developed. As semiconductor devices have been highly integrated, memory cells in the semiconductor devices may be formed within narrow horizontal areas.

SUMMARY

Some embodiments of the inventive concepts may provide semiconductor devices having fin-FETs. According to some embodiments of the inventive concepts, semiconductor devices are provided. A semiconductor device may include a first active fin, a second active fin and a gate structure. The first active fin may extend in a first direction on a substrate and may include a first straight line extension portion, a second straight line extension portion, and a bent portion between the first and second straight line extension portions. The second active fin may extend in the first direction on the substrate. The gate structure may extend in a second direction perpendicular to the first direction on the substrate. The gate structure may cross one of the first and second straight line extension portions of the first active fin and may cross the second active fin.

According to some embodiments of the inventive concepts, semiconductor devices are provided. A semiconductor device may include a first active fin, a plurality of second active fins, a plurality of third active fins, a fourth active fin, a first gate structure, a second gate structure, a third gate structure and a fourth gate structure. The first active fin may extend in a first direction on a substrate. The first active fin may include first and second straight line extension portions and a first bent portion between the first and second straight line extension portions. The plurality of second active fins may extend in the first direction on the substrate and may be spaced apart from each other in the first direction. The plurality of third active fins may extend in the first direction on the substrate and may be spaced apart from each other in the first direction. The plurality of third active fins may be not aligned with the plurality of second active fins in a second direction perpendicular to the first direction. The fourth active fin may extend in the first direction on the substrate. The fourth active fin may include third and fourth straight line extension portions and a second bent portion between the third and fourth straight line extension portions. The first gate structure may cross the first straight line extension portion. The second gate structure may cross the second straight line extension portion and one of the plurality of second active fins. The third gate structure may cross one of the plurality of third active fins and the third straight line extension portion. The fourth gate structure may cross the fourth straight line extension portion.

According to some embodiments of the inventive concepts, semiconductor devices are provided. A semiconductor device may include a first active fin, a second active fin, a first gate structure, and a second gate structure. The first active fin may extend in a first direction on a substrate. The first active fin may include a first straight line extension portion, a second straight line extension portion, and an oblique portion connecting the first and second straight line extension portions. The second active fin may extend in the first direction on the substrate. The second active fin may be parallel to the first and second straight line extension portions of the first active fin. The first and second gate structures may each extend in a second direction perpendicular to the first direction on the substrate. The first and second gate structures may each cross the first and second active fins. The oblique portion may extend in a third direction that is oblique with respect to the first and second directions such that a first distance in the second direction between a first portion of the first active fin between the first and second gate structures and the second active fin is greater than a second distance in the second direction between a second portion of the first active fin not between the first and second gate structures and the second active fin.

BRIEF DESCRIPTION OF THE DRAWINGS

Embodiments of the inventive concepts will be more clearly understood in view of the detailed description and the accompanying drawings.

FIG. 16 is a plan view illustrating a layout of cells of an SRAM according to some embodiments of the inventive concepts.

FIG. 17 is a plan view illustrating a layout of cells of an SRAM according to some embodiments of the inventive concepts.

DETAILED DESCRIPTION

Figure 1:
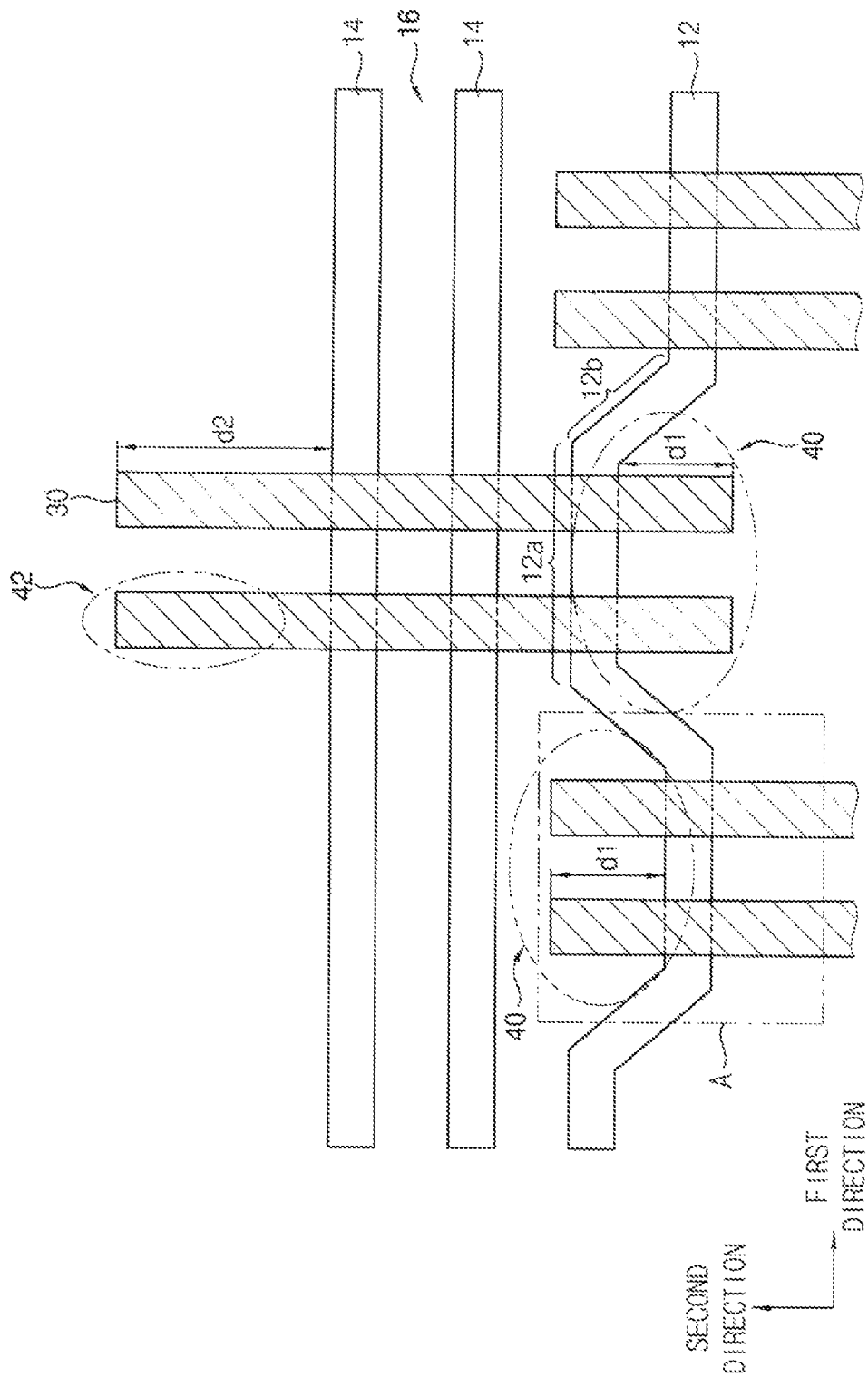
FIG. 1 is a plan view illustrating a layout of a semiconductor device according to some embodiments of the inventive concepts.

Some embodiments of the inventive concepts will be described in detail with reference to the accompanying drawings. Like reference numerals in the drawings denote like elements, and thus their description may be omitted for brevity. Embodiments may be described with reference to ideal views of the inventive concepts. Accordingly, shapes of the views may be modified according to manufacturing techniques and/or allowable errors. Therefore, the embodiments of the inventive concepts are not limited to the specific shape illustrated in the views, but may include other shapes that may be created according to manufacturing processes.

Figure 2:
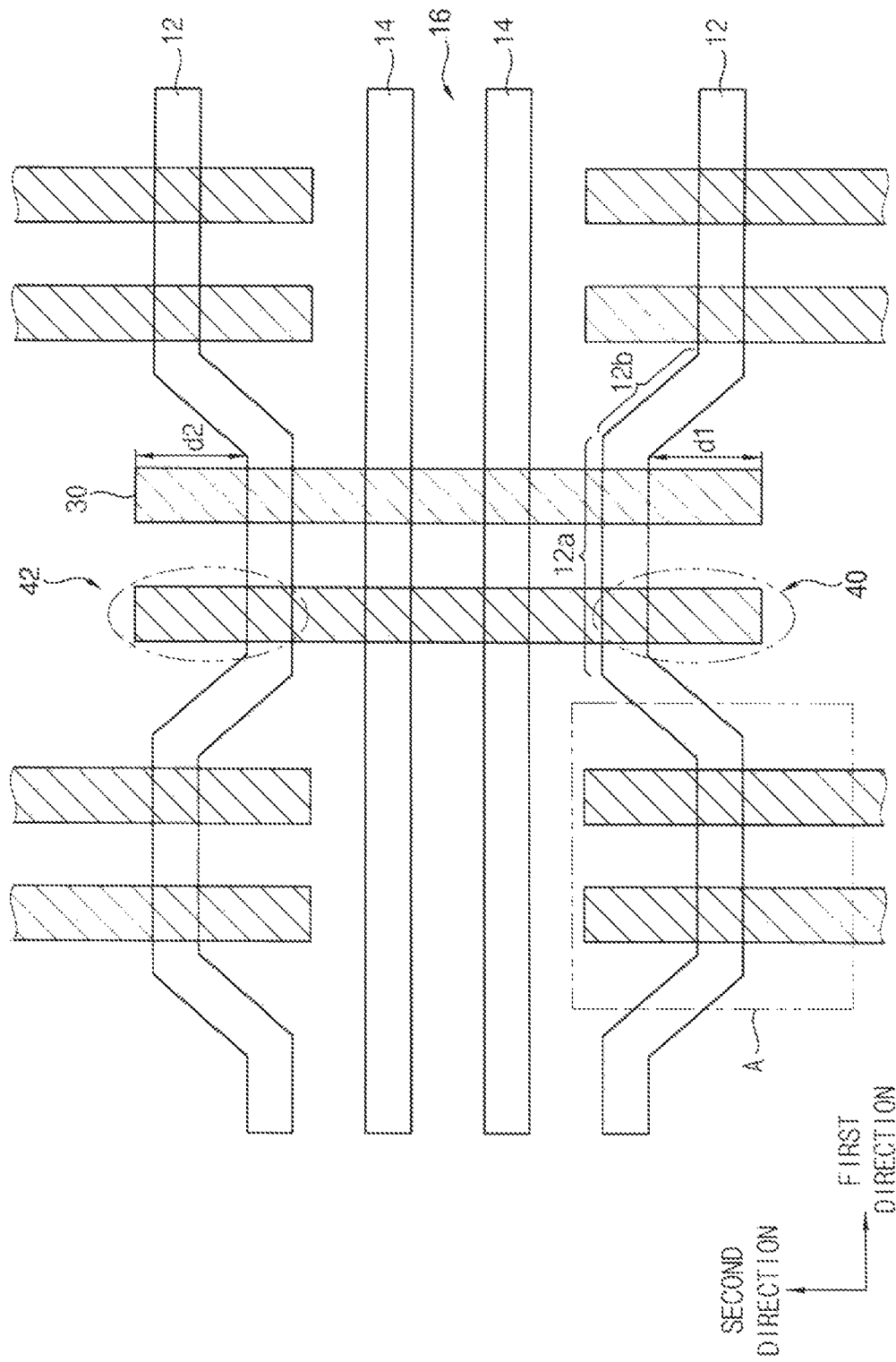
FIG. 2 is a plan view illustrating a layout of a semiconductor device according to some embodiments of the inventive concepts.
Figure 3:
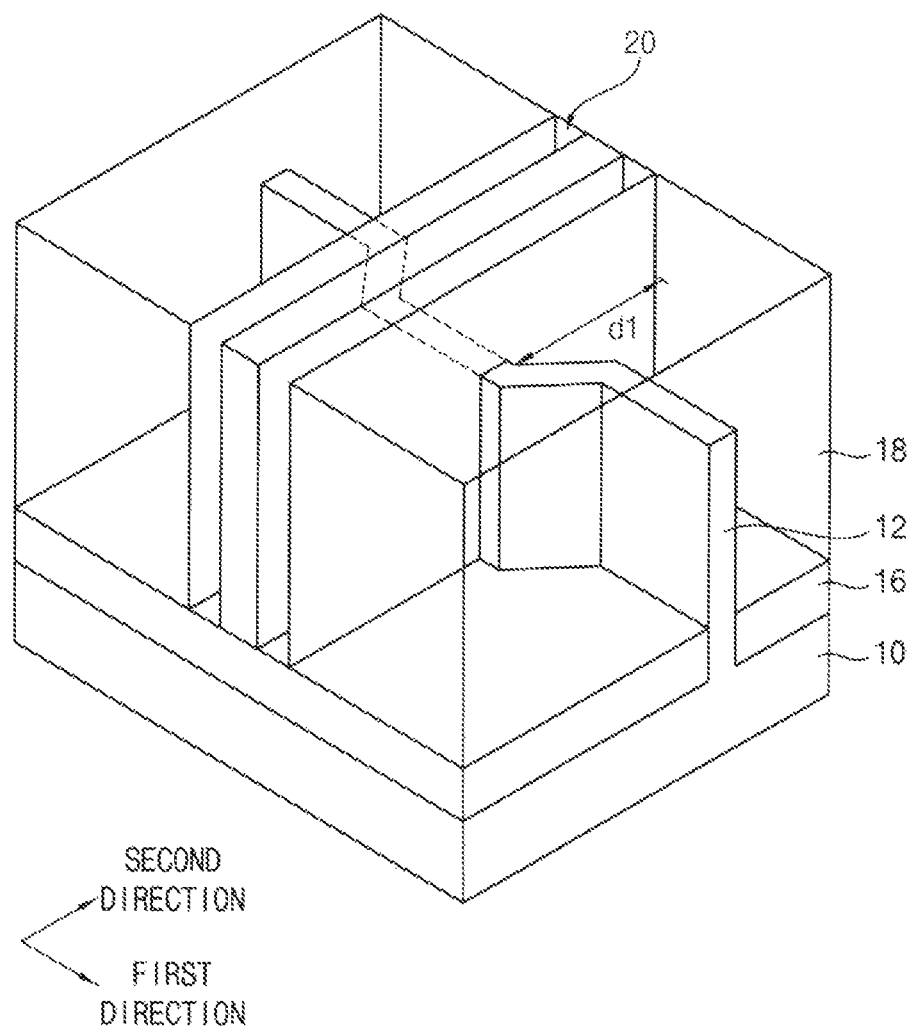
FIGS. 3 and 4 are perspective views illustrating portions A of the semiconductor devices of FIGS. 1 and 2, respectively, according to some embodiments of the inventive concepts.
Figure 4:
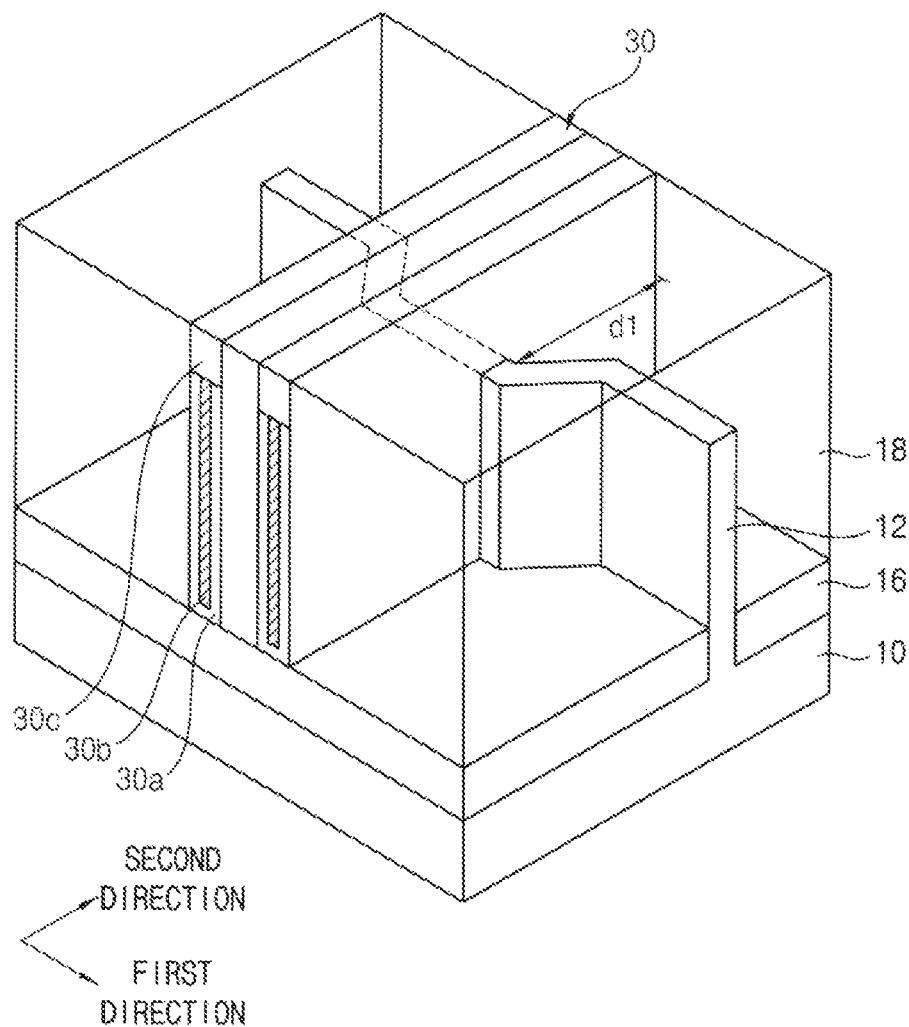

FIG. 1 is a plan view illustrating a layout of a semiconductor device according to some embodiments of the inventive concepts. FIG. 2 is a plan view illustrating a layout of a semiconductor device in accordance with some embodiments of the inventive concepts. FIGS. 3 and 4 are perspective views illustrating portions A of the semiconductor devices of FIGS. 1 and 2, respectively, according to some embodiments of the inventive concepts.

In FIG. 3, a gate structure is not shown.

Layouts of the semiconductor devices of FIGS. 1 and 2 may be substantially the same as or similar to each other, except for the arrangement of first active fins. Thus, the semiconductor devices of FIGS. 1 and 2 are described together. It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

Referring to FIGS. 1 to 4, one or more first active fins 12 and one or more second active fins 14 may protrude upwardly from an upper surface of a substrate 10. One or more gate structures 30 may be formed on the first and second active fins 12 and 14, and may extend across the first and second active fins 12 and 14.

It will be understood that when an element is referred to as being "connected" to, "coupled" to, "on," or "formed on" another element, it may be directly connected to, coupled to, on, or formed on the other element or intervening elements may be present. In contrast, the term "directly" means that there are no intervening elements. It will be understood that spatially relative terms, such as "beneath," "below," "lower," "above," "upper" and the like, are intended to encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations) and the spatially relative descriptors used herein interpreted accordingly.

The substrate 10 may include a semiconductor material, e.g., silicon, germanium, silicon-germanium, etc., or III-V semiconductor compounds, e.g., GaP, GaAs, GaSb, etc. In some embodiments, the substrate 10 may be a silicon-on-insulator (SOI) substrate, or a germanium-on-insulator (GOI) substrate.

The first and second active fins 12 and 14 may extend in a first direction substantially parallel with the upper surface of the substrate 10.

An isolation layer 16 may be formed between the first and second active fins 12 and 14. The isolation layer 16 may fill a lower portion of a trench between the first and second active fins 12 and 14. The isolation layer 16 may include an oxide, e.g., silicon oxide. An active region may be defined as portions of the first and second active fins 12 and 14 not covered by the isolation layer 16.

In some embodiments, the first active fin 12 may include straight line extension portions 12a and bent portions 12b between the straight line extension portions 12a. The bent portion 12b may contact each of opposite ends in the first direction of adjacent straight line extension portions 12a.

The straight line extension portions 12a may extend in the first direction. Neighboring ones of the straight line extension portions 12a in the first direction may not be in the same straight line extending in the first direction.

In some embodiments, the bent portions 12b may extend in an oblique direction with respect to the first direction. The bent portions 12b contacting respective opposite ends of a straight line extension portion 12a may be symmetric with each other.

The straight line extension portions 12a and the bent portions 12b may be alternatively and repeatedly arranged in the first direction, to define a wavy shape of the first active fin 12.

In some embodiments, the second active fins 14 may extend in the first direction having straight line shapes with no bent portions.

In some embodiments, as shown in FIG. 2, the plurality of the second active fins 14 may be formed between ones of the first active fins 12 neighboring in a second direction perpendicular to the first direction.

In some embodiments, ones of the second active fins 14 that extend in the first direction may be a plurality of collinear second active fins 14 spaced apart from each other in the first direction, and the ones of the second active fins 14 including the respective pluralities of collinear second active fins 14 may be arranged in the second direction. In some embodiments, adjacent ones of the second active fins 14 in the second direction may not be arranged in a straight line extending in the second direction but may be arranged in a zig-zag fashion in the second direction.

A first insulating interlayer 18 may be formed on the first and second active fins 12 and 14 and the isolation layer 16. An upper surface of the first insulating interlayer 18 may be substantially flat. The upper surface of the first insulating interlayer 18 may be higher than upper surfaces of the first and second active fins 12 and 14. Thus, the first insulating interlayer 18 may cover the first and second active fins 12 and 14.

The first insulating interlayer 18 may include an opening 20 or a plurality of openings 20. The opening 20 may extend in the second direction across the first and second active fins 12 and 14. The upper surfaces and sidewalls of the first and second active fins 12 and 14 may be exposed by the opening 20.

The gate structure 30 may be formed in the opening 20. The gate structure 30 may extend in the second direction. In some embodiments, a plurality of gate structures 30 may be formed in the plurality of openings 20.

The gate structure 30 may include a gate insulation layer 30*a*, a gate electrode 30*b* and a capping pattern 30*c*. The gate insulation layer 30*a* may be formed on sidewalls and a bottom of the opening 20. Thus, the gate insulation layer 30*a* may be conformally formed on surfaces of the first and second active fins 12 and 14. The gate electrode 30*b* may be formed on the gate insulation layer 30*a*, and may fill a lower portion of the opening 20. That is, the gate insulation layer 30*a* may surround sidewalls and a bottom of the gate electrode 30*b*. The capping pattern 30*c* may be formed on the gate electrode 30*b*, and may fill an upper portion of the opening 20.

In some embodiments, one of gate structures 30 may extend across at least one of the first active fins 12 and at least one of the second active fins 14.

In some embodiments, the gate structure 30 may cross the straight line extension portion 12*a* of the first active fin 12 and the second active fin 14. That is, the gate structure 30 may not cross the bent portion 12*b* of the first active fin 12.

The gate structure 30 may include a first end and a second end in the second direction. A portion of the gate structure 30 adjacent to one of the first and second ends may extend across the straight line extension portion 12*a* of the first active fin 12.

The first active fin 12 may have a wavy shape so that a first distance d1 between one of the first and second ends of the gate structure 30 and the first active fin 12 in the second direction may increase, when compared to that between the one of the first and second ends and a first active fin having a straight line shape. The bent portions 12*b* contacting the straight line extension portion 12*a* crossing the gate structure 30 may be bent to increase the first distance d1 in the second direction between the one of the first and second end portions of the gate structure 30 and the first active fin 12. Thus, one of the straight line extension portions 12*a* of the first active fin 12 crossing the gate structure 30 may be closer to a central portion of the gate structure 30 in the second direction, when compared to other ones of the straight line extension portions 12*a* of the first active fin 12 adjacent thereto in the first direction.

As the first distance d1 in the second direction between the end of the gate structure 30 and the first active fin 12 is increased, failures of a transistor formed on an edge portion of the first active fin 12 may decrease.

Particularly, as shown in FIGS. 3 and 4, the gate structure 30 may be formed in the opening 20 in the first insulating interlayer 18. The opening 20 may be formed by forming a dummy gate including, e.g., polysilicon on the first and second active fins 12 and 14 and removing the dummy gate.

The lower portion of the opening 20 corresponding to the end portion of the gate structure 30 in the second direction may be isolated by the first insulating interlayer 18 and the first active fin 12. When the first distance d1 between an end in the second direction of the opening 20 and the sidewall of the first active fin 12 in the opening 20 is decreased, an internal space of the opening 20 may decrease. Thus, when the dummy gate is removed to form the opening 20, a portion of the dummy gate may remain in the opening 20. Even if the opening 20 is normally formed without the remaining portion of the dummy gate, forming a gate structure 30 including a metal in the opening 20 having a narrow space may not be easy.

However, in some embodiments, as described above, the first active fin 12 may include the straight line extension portion 12*a* and the bent portion 12*b*, so that a length in the second direction of the opening 20 corresponding to an end portion of the gate structure 30 may increase. Removing the dummy gate for forming the opening 20 and forming the gate structure in the opening 20 may be more easily performed. Thus, failures of the transistor including the end portion of the gate structure 30 may decrease.

In some embodiments, as shown in FIG. 1, a first portion 40 adjacent to the first end of the gate structure 30 may cross the straight line extension portion 12*a* of the first active fin 12. Thus, the first distance d1 between the first end of the gate structure 30 and the first active fin 12 may increase. A second portion 42 adjacent to the second end of the gate structure 30 may cross the second active fin 14. A second distance d2 between the second end of the gate structure 30 and the second active fin 14 may be greater than the first distance d1. When the second distance d2 is sufficiently long, the second portion 42 of the gate structure 30 may cross the second active fin 14 with no bent portion without an increase in failures of the transistor.

In some embodiments, as shown in FIG. 2, each of the first edge portion 40 adjacent to the first end of the gate structure 30 and the second edge portion 42 adjacent to the second end of the gate structure 30 may cross a respective straight line extension portion 12*a* of a respective first active fin 12. The second active fins 14 may be formed between the first active fins 12 in the second direction. Thus, each of the first distance d1 between the first end of the gate structure 30 and the first active fin 12 and the second distance d2 between the second end of the gate structure 30 and the first active fin 12 may increase.

The layout of elements in the semiconductor device may be applied to a layout of cells in an SRAM device.

Figure 5:
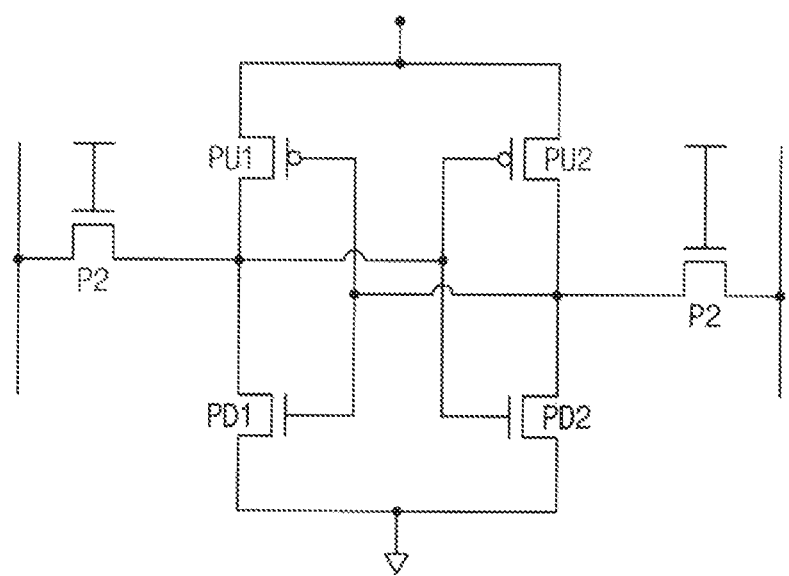
FIG. 5 is a circuit diagram illustrating unit cells of an SRAM according to some embodiments of the inventive concepts.
Figure 6:
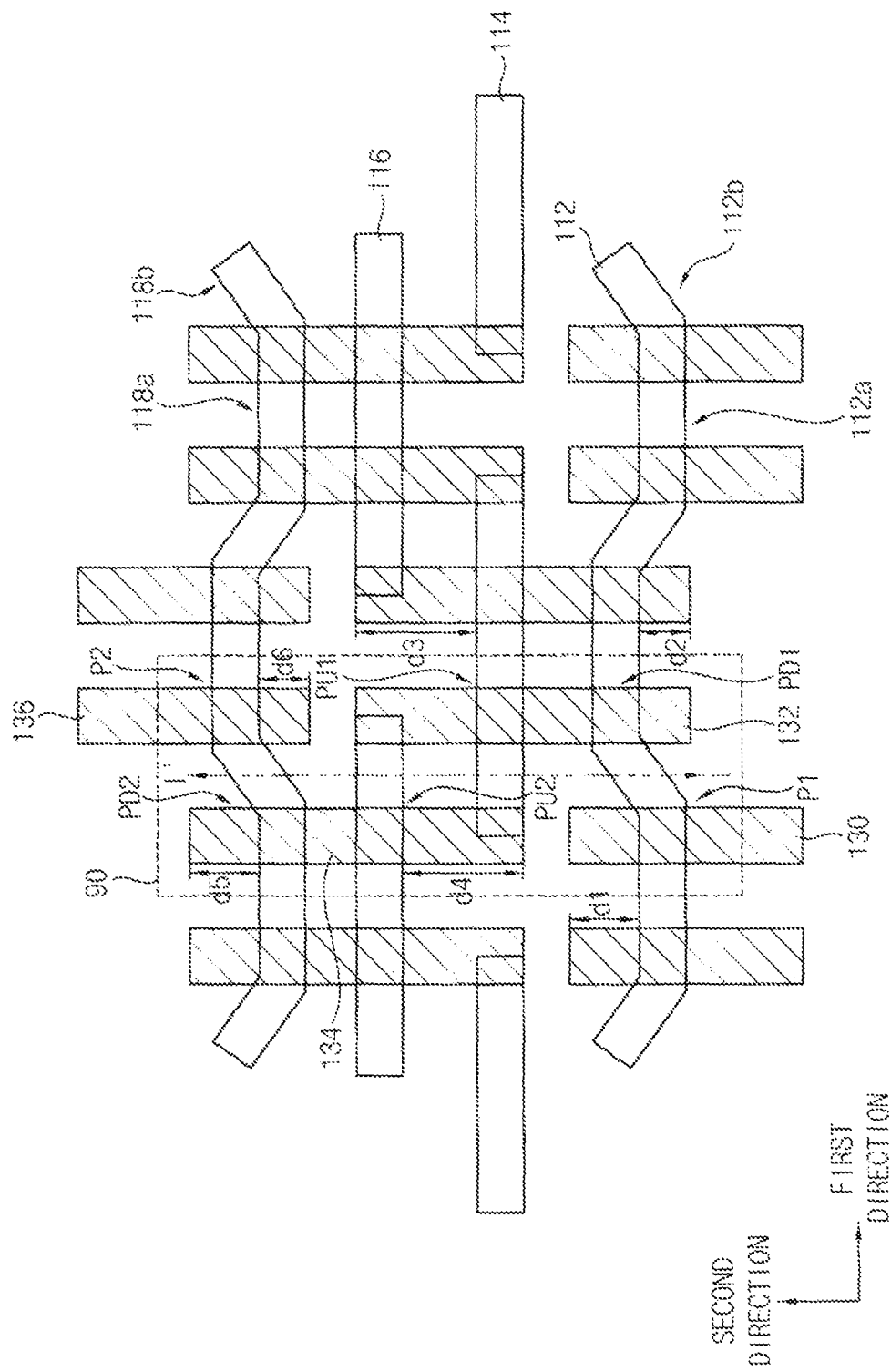
FIG. 6 is a plan view illustrating a layout of cells of an SRAM according to some embodiments of the inventive concepts.
Figure 7:
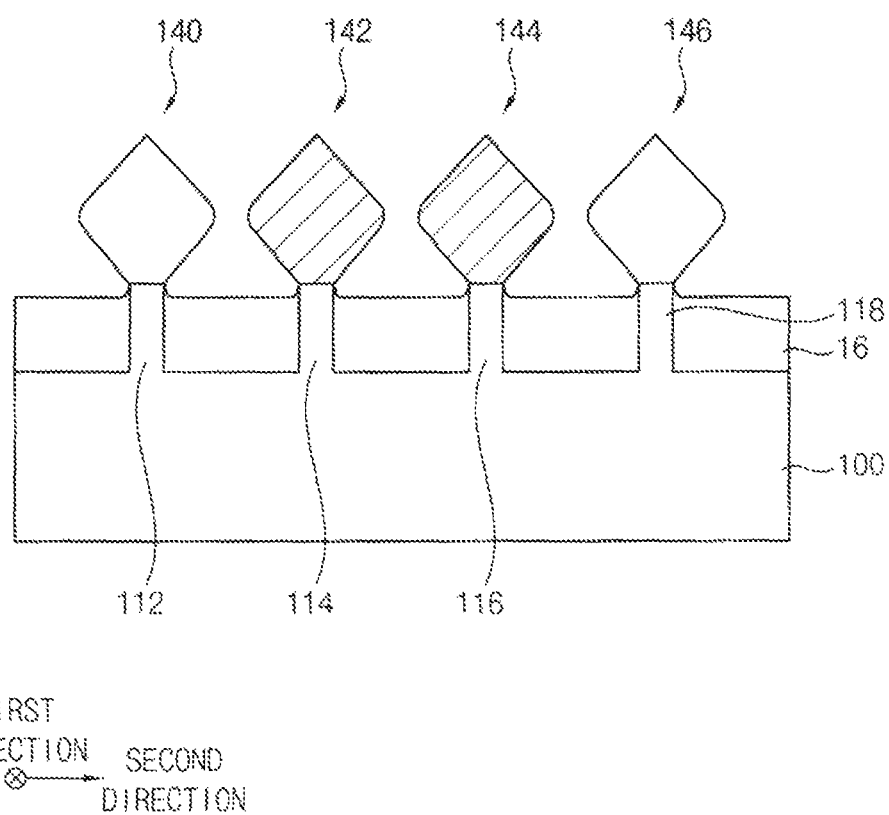
FIG. 7 is a cross-sectional view taken along line I-I' in FIG. 6 according to some embodiments of the inventive concepts.

FIG. 5 is a circuit diagram illustrating unit cells of an SRAM according to some embodiments of the inventive concepts. FIG. 6 is a plan view illustrating a layout of cells of an SRAM according to some embodiments of the inventive concepts. FIG. 7 is a cross-sectional view taken along line I-I' in FIG. 6 according to some embodiments of the inventive concepts.

In FIGS. 6 and 7, contact plugs and wiring are not shown, for convenience of explanation. Hereinafter, one unit cell in the layout may be mainly described. The unit cells may be repeatedly arranged. In some embodiments, the unit cells may be symmetric with each other.

Referring to FIGS. 5 to 7, a unit cell in an SRAM may include a first active fin 112, a second active fin 114, a third active fin 116, a fourth active fin 118, a first gate structure 130, a second gate structure 132, a third gate structure 134 and a fourth gate structure 136.

The first active fin 112 may be in a first row, and may extend in the first direction. The second active fin 114 may be in a second row, and may extend in the first direction. The second row may be spaced apart from the first row in the second direction. A plurality of second active fins 114 may be aligned with each other in the second direction and spaced apart from each other in the first direction. The third active fin 116 may be in a third row, and may extend in the first direction. The third row may be spaced apart from the first and second rows in the second direction with the second row between the first and third rows. A plurality of third active fins 116 may be aligned with each other in the second direction and spaced apart from each other in the first direction. Adjacent ones of the second active fins 114 and the third active fins 116 may be arranged to be shifted without being aligned to each other in the first direction. The fourth active fin 118 may be in a fourth row, and may extend in the first direction. The fourth row may be spaced apart from the first to third rows in the second direction with the third row between the second row and the fourth row. In other words, the second and third active fins 114 and 116 may be between the first active fin 112 and the fourth active fin 118 in the second direction.

The first active fin 112 may include first straight line extension portions 112a and first bent portions 112b with a respective first bent portion 112b between adjacent ones of the first straight line extension portions 112a. The fourth active fin 118 may include fourth straight line extension portions 118a and fourth bent portions 118b with a respective fourth bent portion 118b between adjacent ones of the fourth straight line extension portions 118a. The first and fourth active fins 112 and 118 may have shapes that are substantially the same as or similar to a shape of the first active fin 12 of FIG. 1. In other words, the first and fourth active fins 112 and 118 may have wavy shapes.

In some embodiments, the shapes of the first and fourth active fins 112 and 118 may be substantially the same as each other. In some embodiments, the shapes of the first and fourth active fins 112 and 118 may be different from each other, or may be symmetric with each other.

In some embodiments, the second and third active fins 114 and 116 may have straight line shapes with no bent portions.

In some embodiments, N-type transistors may be formed on the first and fourth active fins 112 and 118 and P-type transistors may be formed on the second and third active fins 114 and 116.

The first, second, third and fourth gate structures 130, 132, 134 and 136 may extend in the second direction.

The first gate structure 130 may cross the first active fin 112. The first gate structure 130 on the first active fin 112 may serve as a gate of a first pass transistor P1. A portion of the first gate structure 130 may cross one of the first straight line extension portions 112a of the first active fin 112. The first straight line extension portion 112a crossing the first gate structure 130 may be closer to a central portion of the first gate structure 130 in the second direction, when compared to an adjacent one of the first straight line extension portions 112a in the first direction. Thus, a first distance d1 between an end of the first gate structure 130 and the first active fin 112 may increase. Accordingly, failures of the first pass transistor P1 may decrease.

The second gate structure 132 may cross both of the first active fin 112 and the second active fin 114. The second gate structure 132 may serve as a common gate of a first pull-down transistor PD1 and a first pull-up transistor PU1.

The second gate structure 132 on the first active fin 112 may serve as a gate of the first pull-down transistor PD1. A first portion of the second gate structure 132 may cross one of the straight line extension portions 112a of the first active fin 112. The first straight line extension portion 112a crossing the second gate structure 132 may be closer to a central portion of the second gate structure 132 in the second direction, when compared to an adjacent one of the first straight line extension portions 112a in the first direction. Thus, a second distance d2 between a first end of the second gate structure 132 and the first active fin 112 may increase. Accordingly, failures of the first pull-down transistor PD1 may decrease.

The second gate structure 132 on the second active fin 114 may serve as a gate of the first pull-up transistor PU1. A second portion of the second gate structure 132 may extend to the third active fin 116. In some embodiments, a third distance d3 between a second end of the second gate structure 132 and the second active fin 114 may be greater than the second distance d2.

The third gate structure 134 may cross the third active fin 116 and the fourth active fin 118. The third gate structure 134 may serve as a common gate of a second pull-down transistor PD2 and a second pull-up transistor PU2.

The third gate structure 134 on the third active fin 116 may serve as a gate of the second pull-up transistor PU2. A first portion of the third gate structure 134 may extend to the second active fin 114. A distance between a first end of the third gate structure 134 and the third active fin 116 may be a fourth distance d4.

The third gate structure 134 on the fourth active fin 118 may serve as a gate of the second pull-down transistor PD2. A second portion of the third gate structure 134 may cross one of the straight line extension portions 118a of the fourth active fin 118. The fourth straight line extension portion 118a crossing the third gate structure 134 may be closer to a central portion of the third gate structure 134 in second direction, when compared to an adjacent one of the fourth straight line extension portions 118a in the first direction. Thus, a fifth distance d5 between a second end adjacent to the second portion of the third gate structure 134 and the fourth active fin 118 may increase. Accordingly, failures of the second pull-down transistor PD1 may decrease. The fourth distance d4 may be greater than the fifth distance d5.

The fourth gate structure 136 may cross the fourth active fin 118. The fourth gate structure 136 on the fourth active fin 118 may serve as a gate of a second pass transistor P2. A portion of the fourth gate structure 136 may cross one of the fourth straight line extension portions 118a of the fourth active fin 118. The fourth straight line extension portion 118a crossing the fourth gate structure 136 may be closer to a central portion of the fourth gate structure 136 in the second direction, when compared to an adjacent one of the fourth straight line extension portions 118a in the first direction. Thus, a sixth distance d6 between an end of the fourth gate structure 136 and the fourth active fin 118 may increase. Accordingly, failures of the second pass transistor P2 may decrease.

The first, second, third and fourth gate structures 130, 132, 134 and 136 may be formed in the openings in the first insulating interlayer, respectively. The first, second, third and fourth gate structures 130, 132, 134 and 136 may include a metal. The first, second, third and fourth gate structures 130, 132, 134 and 136 may have stack structures substantially the same as or similar to a stack structure of the gate structure 30 illustrated with reference to FIGS. 1 to 4.

Portions of the first, second, third and fourth active fins 112, 114, 116 and 118 between the first, second, third and fourth gate structures 130, 132, 134 and 136 may serve as impurity regions of the transistors.

Referring to FIG. 7, a first recess may be formed on the first active fin 112 between the first and second gate structures 130 and 132. A second recess may be formed on the second active fin 114 between the second and third gate structures 132 and 134. A third recess may be formed on the third active fin 116 between the second and third gate structures 132 and 134. A fourth recess may be formed on the fourth active fin 118 between the third and fourth gate structures 134 and 136.

A first epitaxial pattern 140 may fill the first recess. The first epitaxial pattern 140 may protrude in the second direction from the first active fin 112. The first epitaxial pattern 140 may serve as an impurity region of an N-type transistor. The first epitaxial pattern 140 may include silicon. The first epitaxial pattern 140 may include n-type impurities.

A second epitaxial pattern 142 may fill the second recess. The second epitaxial pattern 142 may protrude in the second direction from the second active fin 114. The second epitaxial pattern 142 may serve as an impurity region of a P-type transistor. The second epitaxial pattern 142 may include silicon germanium. The second epitaxial pattern 142 may include p-type impurities.

A third epitaxial pattern 144 may fill the third recess. The third epitaxial pattern 144 may protrude in the second direction from the third active fin 116. The third epitaxial pattern 144 may serve as an impurity region of a P-type transistor. The third epitaxial pattern 144 may include silicon germanium. The third epitaxial pattern 144 may include p-type impurities.

A fourth epitaxial pattern 146 may fill the fourth recess. The fourth epitaxial pattern 146 may protrude in the second direction from the fourth active fin 118. The fourth epitaxial pattern 146 may serve as an impurity region of an N-type transistor. The fourth epitaxial pattern 146 may include silicon. The fourth epitaxial pattern 146 may include n-type impurities.

The first gate structure 130 of the first pass transistor P1 and the second gate structure 132 of the first pull-down transistor PD1 may cross the first active fin 112 having the wavy shape, so that the first and second distances d1 and d2 may increase. The third gate structure 134 of the second pull-down transistor PD2 and the fourth gate structure 136 of the second pass transistor P2 may cross the fourth active fin 118 having the wavy shape, so that the fifth and sixth distances d5 and d6 may increase. Thus, failures of the first pass transistor, the first pull-down transistor, the second pull-down transistor and the second pass transistor formed on the first and fourth active fins 112 and 118 may decrease.

Figure 8:
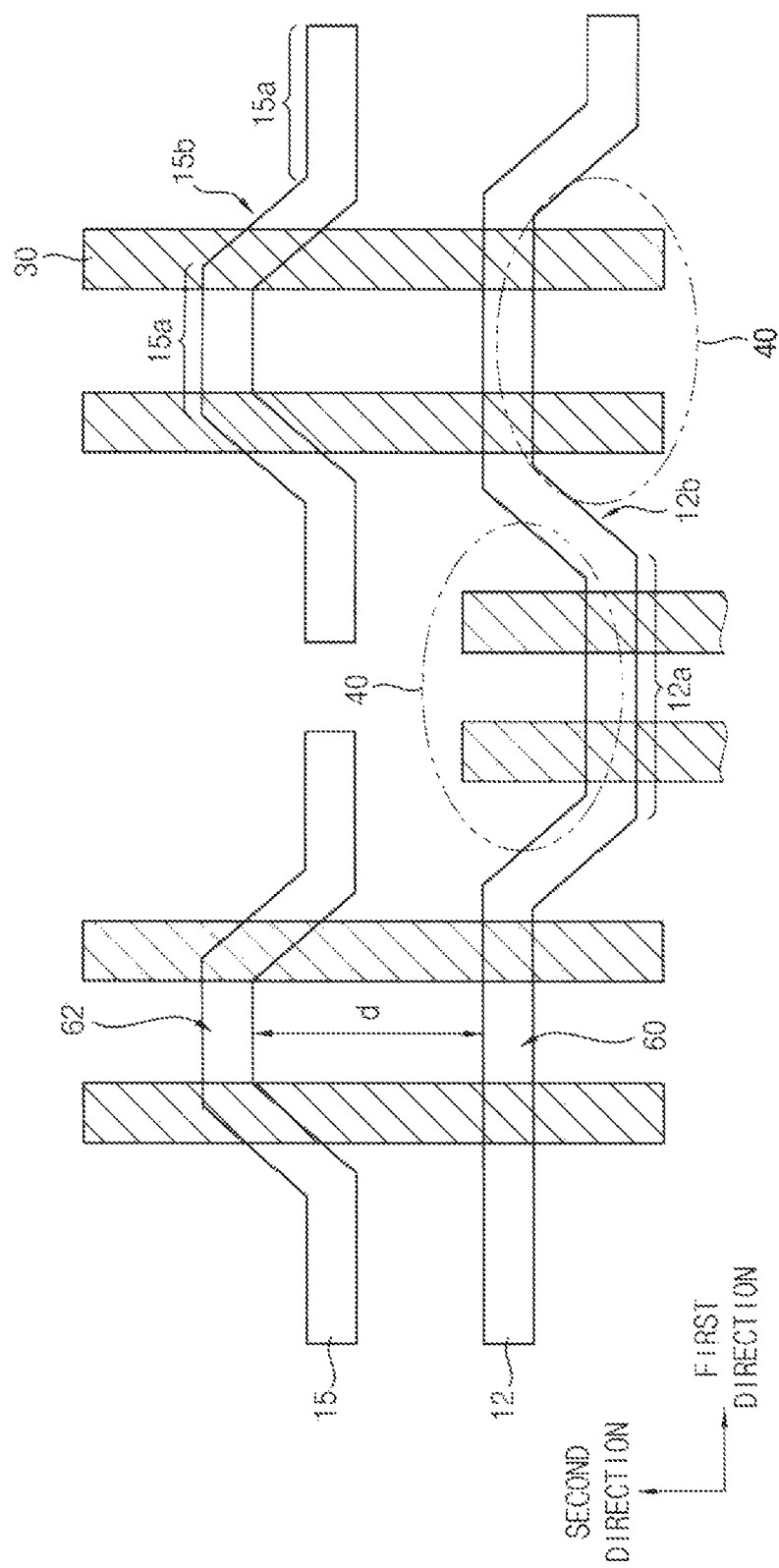
FIG. 8 is a plan view illustrating a layout of a semiconductor device according to some embodiments of the inventive concepts.

FIG. 8 is a plan view illustrating a layout of a semiconductor device according to some embodiments of the inventive concepts.

The semiconductor device of FIG. 8 may be substantially the same as or similar to the semiconductor device of FIG. 1, except for the shapes of second active fins.

Referring to FIG. 8, a plurality of first active fins 12 and a plurality of second active fins 15 may protrude upwardly from an upper surface of the substrate 10. The gate structure 30 may be formed on the first and second active fins 12 and 15, may extend across the first and second active fins 12 and 15.

The first active fin 12 may be substantially the same as or similar to that illustrated with reference to FIG. 1. That is, the first active fin 12 may include the first straight line extension portion 12a and the first bent portion 12b, and may have a wavy shape.

The second active fin 15 may include second straight line extension portions 15a and a second bent portion 15b therebetween. In some embodiments, a plurality of second active fins 15 may be spaced apart from each other in the first direction.

In some embodiments, the second active fin 15 may extend in the first direction without being cut in the middle thereof.

In some embodiments, each of the gate structures 30 may extend in the first direction.

In some embodiments, each of the gate structures 30 may cross both of at least one of the first active fins 12 and at least one of the second active fins 15. In some embodiments, two parallel gate structures 30 may be formed on one of the second active fins 15. Thus, two transistors may be formed on one of the second active fin 15.

In some embodiments, a portion 40 adjacent to at least one end of the gate structure 30 may cross the first straight line extension portion 12a of the first active fin 12. One of the first straight line extension portions 12a crossing the gate structure 30 may be closer to a central portion of the gate structure 30 in the second direction, when compared to another one of the straight line extension portions 12a adjacent thereto in the first direction. Thus, failures of the gate structure 30 may decrease.

The gate structure 30 may cross the second bent portion 15b of the second active fin 15. That is, the second bent portion 15b may be overlapped with a lower surface of the gate structure 30. A bending direction of the second bent portion 15b may be the same as or similar to that of a bending direction of one of the first bent portions 12b corresponding thereto in the second direction.

A first impurity region 60 may be formed at the first active fin 12 between the first gate structures 30. In some embodiments, the first impurity region 60 may be formed at the first straight line extension portion 12a between the first bent portions 12b. A second impurity region 62 may be formed at the second active fin 15 between the gate structures 30. That is, the second impurity region 62 may be formed at the second straight line extension portion 15a between the second bent portions 15b.

When the second active fin 15 includes the second bent portion 15b, a distance d in the second direction between the first and second impurity regions 60 and 62 may increase. Thus, failures due to a small distance between the first and second impurity regions 60 and 62 may decrease.

The layout of elements in the semiconductor device may be applied to a layout of cells in an SRAM device.

Figure 9:
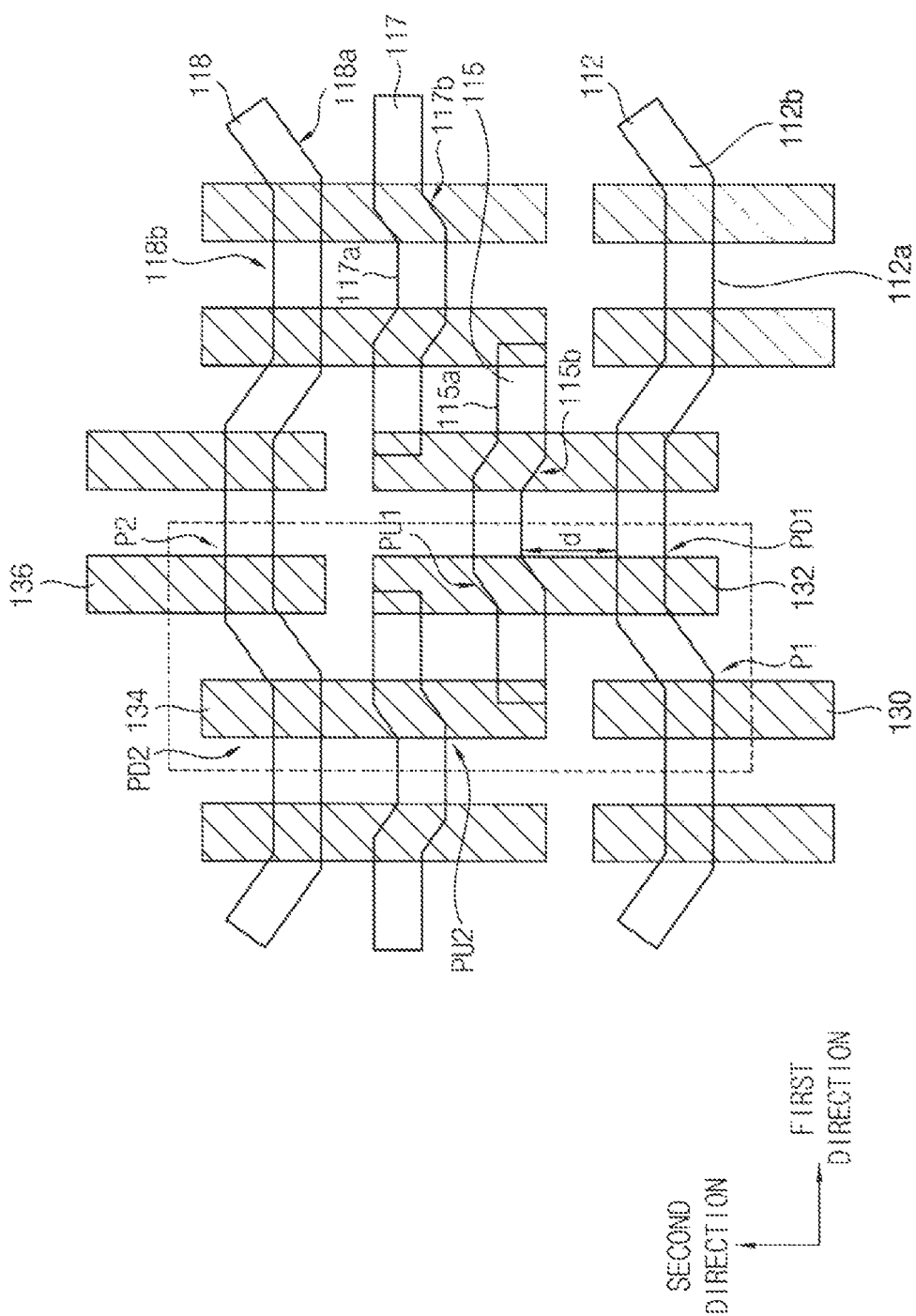
FIG. 9 is a plan view illustrating a layout of cells of an SRAM according to some embodiments of the inventive concepts.

FIG. 9 is a plan view illustrating a layout of cells of an SRAM according to some embodiments of the inventive concepts.

Referring to FIG. 9, the unit cell in the SRAM may include the first active fin 112, the second active fin 115, the third active fin 117, the fourth active fin 118, the first gate structure 130, the second gate structure 132, the third gate structure 134 and the fourth gate structure 136.

The first active fin 112 in a first row may be substantially the same as or similar to that illustrated with reference to FIG. 6. The fourth active fin 118 in a fourth row may be substantially the same as or similar to that illustrated with reference to FIG. 6. Each of the first and fourth active fins 112 and 118 may have a wavy shape.

The second active fin 115 in a second row may include second straight line extension portions 115a and a second bent portion 115b between the second straight line extension portions 115a. A plurality of second active fins 115 may be arranged in the first direction to be spaced apart from each other.

The third active fin 117 in a third row may include third straight line extension portions 117a and a third bent portion 117b between the second straight line extension portions 117a. A plurality of third active fins 117 may be arranged in the first direction to be spaced apart from each other.

The second and the third active fins 115 and 117 may be shifted without being aligned to each other in the second direction.

The first, second, third and fourth gate structures 130, 132, 134 and 136 may extend in the second direction. In the transistors, functions of the first, second, third and fourth gate structures 130, 132, 134 and 136 may be substantially the same as or similar to functions of the first, second, third and fourth gate structures illustrated with reference to FIG. 6, respectively.

The first and fourth gate structures 130 and 136 may have a layout substantially the same as or similar to that of the first and fourth gate structures illustrated with reference to FIG. 6, respectively.

The first portion of the second gate structure 132 may cross the first straight line extension portion 112a of the first active fin 112. One of the first straight line extension portions 112a crossing the second gate structure 132 may be closer to a center portion of the second gate structure 132 in the second direction, when compared to another one of the first straight line extension portions 112a in the first direction. The second gate structure 132 may cross the second bent portion 115b of the second active fin 115. The second portion of the second gate structure 132 may extend to the third active fin 117. A bending direction of the second bent portion 115b may be the same as or similar to a bending direction of the first bent portion 112b corresponding to the second bent portion 115b in the second direction.

The third gate structure 134 may cross the third bent portion 117b of the third active fin 117. The first portion of the third gate structure 134 may extend to the second active fin 115. The second portion of the third gate structure 134 may cross the fourth straight line extension portion 118a of the fourth active fin 118. One of the fourth straight line extension portions 118a crossing the third gate structure 134 may be closer to a center portion of the third gate structure 134 in the second direction, when compared to another one of the fourth straight line extension portions 118a in the first direction. A bending direction of the third bent portion 117b may be the same as or similar to a bending direction of the fourth bent portion 118b corresponding to the third bent portion 117b in the second direction.

Each of the first, second, third and fourth active fins 112, 115, 117 and 118 between the first, second, third and fourth gate structures 130, 132, 134 and 136 may serve as an impurity region of one of the transistors. In some embodiments, as illustrated with reference to FIGS. 6 and 7, the first, second, third and fourth active fins 112, 115, 117 and 118 may include recesses, respectively. The first, second, third and fourth epitaxial patterns doped with impurities may be formed in the recesses, respectively.

As the first and fourth active fins 112 and 118 may have wavy shapes, failures of the gate structures 130 and 136 formed on the first and fourth active fins 112 and 118 may decrease. As the second and third active fins 115 and 117 may have wavy shapes, a distance in the second direction d between the impurity regions may increase.

Figure 10:
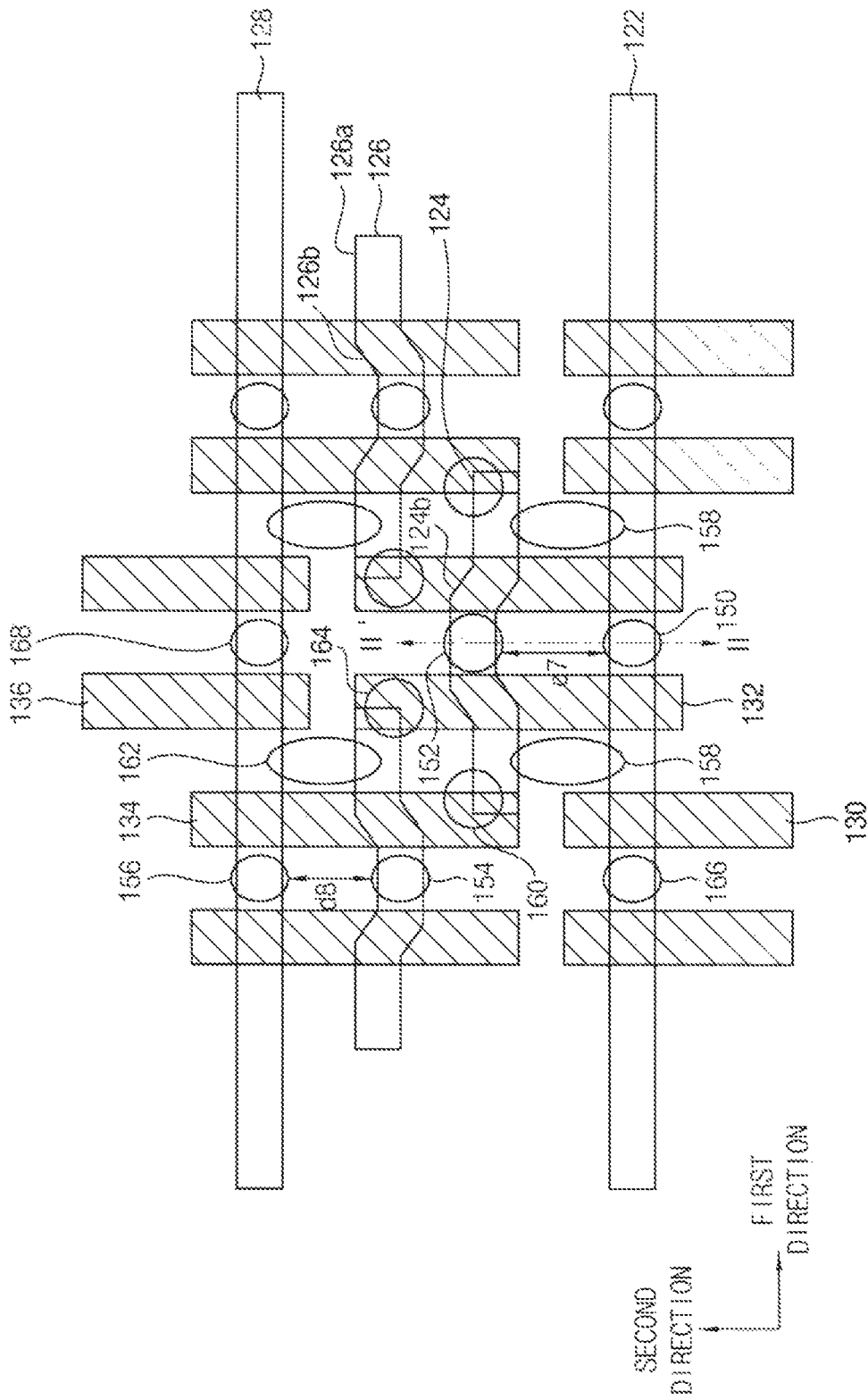
FIG. 10 is a plan view illustrating a layout of cells of an SRAM according to some embodiments of the inventive concepts.
Figure 11:
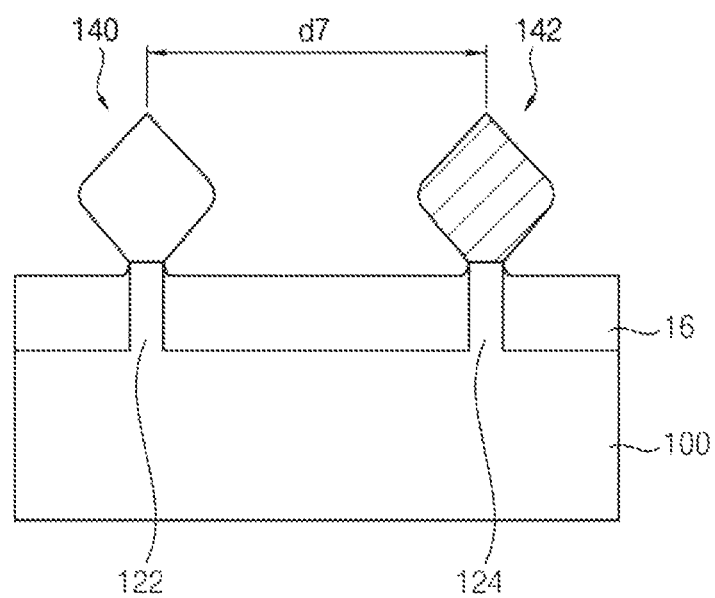
FIG. 11 is a cross-sectional view taken along line II-II' in FIG. 10 according to some embodiments of the inventive concepts.

FIG. 10 is a plan view illustrating a layout of cells of an SRAM according to some embodiments of the inventive concepts. FIG. 11 is a cross-sectional view taken along line II-II' in FIG. 10 according to some embodiments of the inventive concepts.

In FIG. 10, contact plugs are shown, while the contact plugs are not shown in FIG. 11.

The unit cell in the SRAM may be substantially the same as or similar to the unit cell in the SRAM illustrated with reference to FIG. 9, except for the shapes of first, second, third and fourth active fins.

Referring to FIGS. 10 and 11, a unit cell in the SRAM may include a first active fin 122, a second active fin 124, a third active fin 126, a fourth active fin 128, the first gate structure 130, the second gate structure 132, the third gate structure 134 and the fourth gate structure 136.

The first active fin 122 in a first row may extend in the first direction with no bent portion.

The second active fin 124 in a second row may include second straight line extension portions 124a and a second bent portion 124b between the second straight line extension portions 124a. The third active fin 126 in a third row may include third straight line extension portions 126a and a third bent portion 126b between the second straight line extension portions 126a. The second and third active fins 124 and 126 may be substantially the same as or similar to the second and third active fins 115 and 117, respectively, illustrated with reference to FIG. 9.

The fourth active fin 128 in a fourth row may extend in the first direction with no bent portion.

The first, second third and fourth gate structures 130, 132, 134 and 136 may extend in the second direction. Functions and arrangements of the first, second third and fourth gate structures 130, 132, 134 and 136 may be substantially the same as or similar to functions and arrangements of those illustrated with reference to FIG. 6.

Two second gate structures 132 may be formed on one of the second active fins 124. A first portion of the second gate structure 132 may cross the second bent portion 124b of the second active fin 124. The second bent portion 124b may be bent so that a distance in the second direction from the second active fin 124 between the two the second gate structures 132 to the first active fin 122 may increase.

In the same manner, the third gate structure 134 may cross the third bent portion 126b of the third active fin 126. Two third gate structures 134 may be formed on the one of third active fins 126. The third bent portion 126b may be bent so that an eighth distance d8 in the second direction from the third active fin 126 between the two the third gate structure 134 to the fourth active fin 128 may increase.

Each of the first, second, third and fourth active fins 122, 124, 126 and 128 between the first, second, third and fourth gate structures 130, 132, 134 and 136 may serve as an impurity region of one of the transistors. In some embodiments, as illustrated with reference to FIGS. 6 and 7, the first, second, third and fourth active fins 122, 124, 126 and 128 may include recesses, respectively. The first, second, third and fourth epitaxial patterns 140, 142, 144 and 146 (refer to FIG. 7) may fill the recesses, respectively.

The first and fourth epitaxial patterns 140 and 146 may include silicon, and may be doped with N-type impurities. The second and third epitaxial patterns 142 and 144 may include silicon germanium, and may be doped with P-type impurities. The first, second, third and fourth epitaxial patterns 140, 142, 144 and 146 may protrude in the second direction from the first, second, third and fourth active fins 122, 124, 126 and 128, respectively.

In some embodiments, the second epitaxial pattern 142 may be formed on the second active fin 124 between two second gate structures 132. The first epitaxial pattern 140 may be formed on the first active fin 122 between two second gate structures 132. A first contact plug 150 and a second contact plug 152 may be formed on the first and second epitaxial patterns 140 and 142, respectively. The first and second contact plugs 150 and 152 may not be electrically short.

The first epitaxial pattern 140 may be formed by a first selectively epitaxial growth process, so that the first epitaxial pattern 140 may protrude in the second direction from the first active fin 122, as shown in FIG. 11. The second epitaxial pattern 142 may be formed by a second selectively epitaxial growth process, so that the second epitaxial pattern 142 may protrude in the second direction from the second active fin 124, as shown in FIG. 11. Thus, when a distance between the first and second epitaxial patterns 140 and 142 decreases, an electrical short between the first and second epitaxial patterns 140 and 142 may occur.

However, in some embodiments, the second active fin 124 may have a wavy shape, so a seventh distance d7 between first and second active fins 122 and 124, which may be formed between the second gate structures 132, may increase. Thus, the electrical short between the first and second epitaxial patterns 140 and 142 may decrease.

Similarly, two the third gate structures 134 may cross one of the third active fins 126. The third epitaxial pattern 144 (refer to FIG. 7) may be formed on the third active fin 126 between two the third gate structures 134. The fourth epitaxial pattern 146 (refer to FIG. 7) may be formed on the fourth active fin 128 between two the third gate structures 134. A third contact plug 154 and a fourth contact plug 156 may be formed on the third and fourth epitaxial patterns 144 and 146, respectively.

The third active fin 126 may have a wavy shape, so the eighth distance d8 in the second direction between third and fourth active fins 126 and 128 may increase. Thus, the electrical short between the third and fourth epitaxial patterns 144 and 146 may decrease.

In some embodiments, the second epitaxial pattern 142 may be formed at an end portion in the first direction of one of the second active fins 124. The second epitaxial pattern 142 may be electrically connected to one of the first epitaxial patterns 140 corresponding thereto in the second direction via a fifth contact plug 158. The second epitaxial pattern 142 may be electrically connected to a neighboring one of the third gate structures 134 via a sixth contact plug 160.

Similarly, the third epitaxial pattern 144 may be formed at an end portion in the first direction of one of the third active fins 126. The third epitaxial pattern 144 may be electrically connected to one of the fourth epitaxial patterns 146 corresponding thereto in the second direction via a seventh contact plug 162. The third epitaxial pattern 144 may be electrically connected to a neighboring one of the second gate structures 132 via an eighth contact plug 164.

A ninth contact structure 166 may be formed on the first epitaxial pattern 140 between the first gate structures 130. A tenth contact structure 168 may be formed on the fourth epitaxial pattern 146 between the fourth gate structures 136.

As described above, the second and the third active fins 124 and 126 may have the wavy shapes, so that an electrical short between the epitaxial patterns may decrease.

Figure 12:
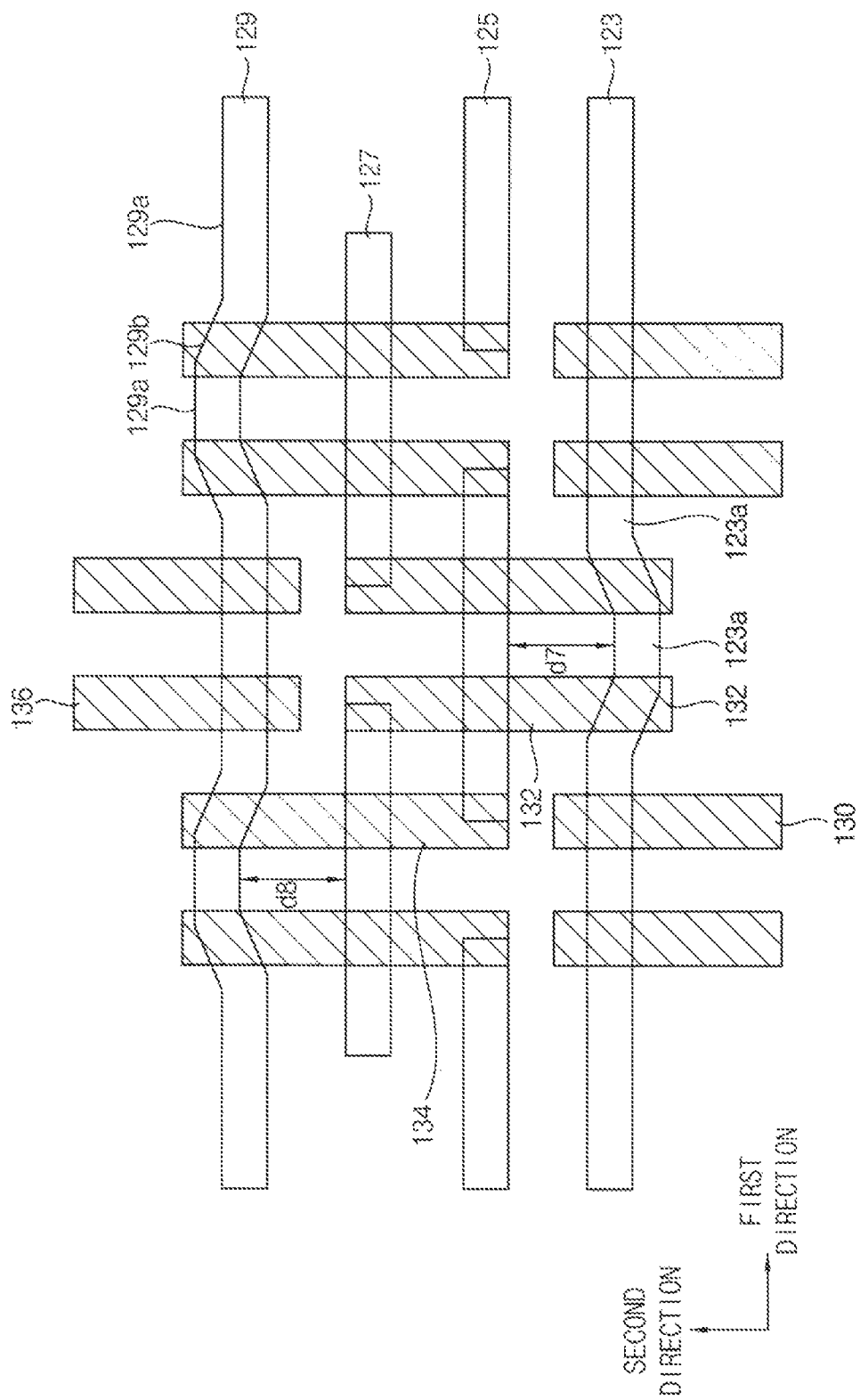
FIG. 12 is a plan view illustrating a layout of cells of an SRAM according to some embodiments of the inventive concepts.

FIG. 12 is a plan view illustrating a layout of cells of an SRAM according to some embodiments of the inventive concepts.

The unit cell in the SRAM may be substantially the same as or similar to the unit cell in the SRAM illustrated with reference to FIG. 6, except for the shapes of the first, second, third and fourth active fins.

Referring to FIG. 12, a unit cell in the SRAM may include a first active fin 123, a second active fin 125, a third active fin 127, a fourth active fin 129, the first gate structure 130, the second gate structure 132, the third gate structure 134 and the fourth gate structure 136.

The first active fin 123 in a first row may include first straight line extension portions 123a and a first bent portion 123b between the first straight line extension portions 123a.

The second and third active fins 125 and 127 may be in a second row and a third row, respectively. The second and third active fins 125 and 127 may be substantially the same as or similar to the second and third active fins 114, 116, respectively, illustrated with reference to FIG. 6.

The fourth active fin 129 in a fourth row may include fourth straight line extension portions 129a and a fourth bent portion 129b between the fourth straight line extension portions 129a.

The first, second, third and fourth gate structures 130, 132, 134 and 136 may extend in the second direction. Functions of the first, second third and fourth gate structures 130, 132, 134 and 136 may be substantially the same as or similar to functions of those illustrated with reference to FIG. 6.

The first gate structure 130 may extend across the first straight line portion 123a of the first active fin 123. The impurity region may be formed at the first straight line portion 123a of the first active fin 123 between the first gate structures 130.

The second gate structure 132 may extend across the first and second active fins 123 and 125. The second gate structure 132 may cross the first bent portion 123b of the first active fin 123. That is, the second gate structure 132 may be overlapped with the first bent portion 123b. The first bent portion 132b may be bent in a direction to increase the distance between the neighboring first and second active fins 123 and 125. The impurity region may be formed at the first straight line portion 123a of the first active fin 123 between the second gate structures 132.

The third gate structure 134 may extend across the third and fourth active fins 127 and 129. The third gate structure 134 may cross the fourth bent portion 129b of the fourth active fin 129. The fourth bent portion 129b may be bent in a direction to increase the distance between the neighboring third and fourth active fins 127 and 129. The impurity region may be formed at the fourth straight line extension portion 129a of the fourth active fin 129 between the third gate structures 134.

The fourth gate structure 136 may extend across the fourth straight line extension portion 129a of the fourth active fins 129. The impurity region may be formed at the fourth straight line portion 129a of the fourth active fin 129 between the fourth gate structures 136.

As described with reference to FIG. 7, the first, second, third and fourth epitaxial patterns 140, 142, 144 and 146 may be formed at the first, second, third and fourth active fins 123, 125, 127 and 129 between the gate structures 130, 132 134 and 136, respectively. As described with reference to FIG. 10, the first, second, third, fourth, fifth, sixth, seventh, eighth, ninth, tenth contact plugs 150, 152, 154, 156, 158, 160, 162, 164, 166 and 168 may be formed.

As described above, the first active fin 123 may have a wavy shape, so that the seventh distance d7 in the second direction between the first and second active fins 123 and 125 formed between the second gate structures 132 may increase. Thus, an electrical short between the first and second epitaxial patterns 140 and 142 may decrease. The fourth active fin 129 may have a wavy shape, so that the eighth distance d8 in the second direction between the third and fourth active fins 127 and 129 formed between the third gate structures 134 may increase. Thus, an electrical short between the third and fourth epitaxial patterns 144 and 146 may decrease.

Figure 13:
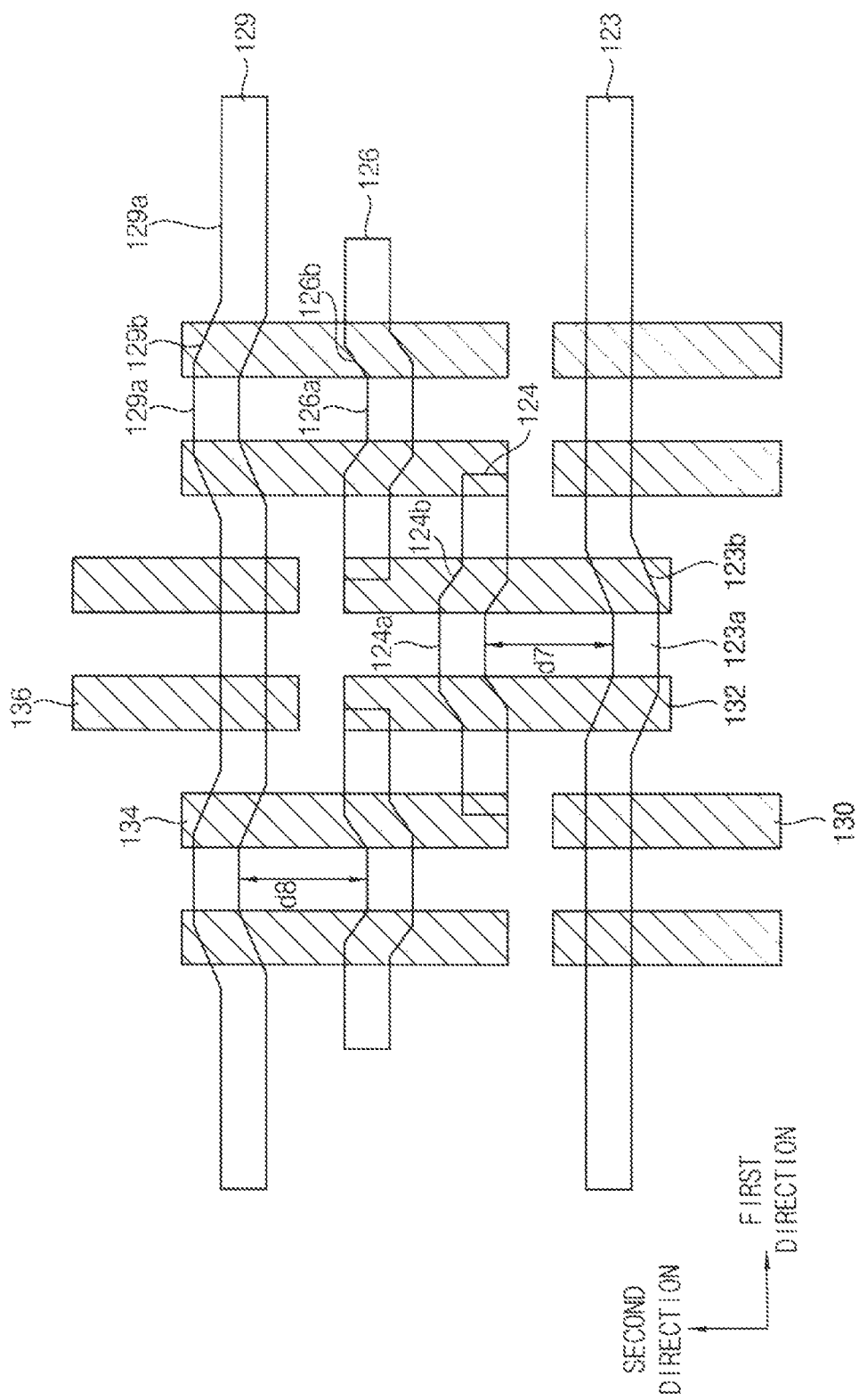
FIG. 13 is a plan view illustrating a layout of cells of an SRAM according to some embodiments of the inventive concepts.

FIG. 13 is a plan view illustrating a layout of cells of an SRAM according to some embodiments of the inventive concepts.

Referring to FIG. 13, a unit cell in the SRAM may include the first active fin 123, the second active fin 124, the third active fin 126, the fourth active fin 129, the first gate structure 130, the second gate structure 132, the third gate structure 134 and the fourth gate structure 136.

The first active fin 123 in a first row may include the first straight line extension portions 123a and the first bent portion 123b between the first straight line extension portions 123a. The first active fin 123 may be substantially the same as or similar to that illustrated with reference to FIG. 12.

The second active fin 124 in a second row may include the second straight line extension portions 124a and the second bent portion 124b between the second straight line extension portions 124a. The third active fin 126 in a third row may include the third straight line extension portions 126a and the third bent portion 126b between the third straight line extension portions 126a. The second and third active fins 124 and 126 may be substantially the same as or similar to those illustrated with reference to FIG. 10.

The fourth active fin 129 in a fourth row may include the fourth straight line extension portions 129a and the fourth bent portion 129b between the fourth straight line extension portions 129a. The fourth active fin 129 may be substantially the same as or similar to that illustrated with reference to FIG. 12.

In the transistors, functions of the first, second, third and fourth gate structures 130, 132, 134 and 136 may be substantially the same as or similar to functions of those illustrated with reference to FIG. 6, respectively.

The first gate structure 130 may extend across the first straight line extension portion 123a of the first active fin 123. The first gate structure 130 may be substantially the same as or similar to that illustrated with reference to FIG. 12.

The second gate structure 132 may extend across the first bent portion 123b of the first active fin 123 and the second bent portion 124b of the second active fin 124. That is, the second gate structure 132 may be overlapped with the first bent portion 123b and the second bent portion 124b. Each of the first and second bent portions 123b and 124b may be bent in a direction to increase the distance between the neighboring first and second active fins 123 and 124. As shown in FIG. 13, the first and second bent portions 123b and 124b may be symmetric with respect to the first direction.

The third gate structure 134 may extend across the third bent portion 126b of the third active fin 126 and the fourth bent portion 129b of the fourth active fin 129. That is, the third gate structure 134 may be overlapped with the third bent portion 126b and the fourth bent portion 129b. Each of the third and fourth bent portions 126b and 129b may be bent in a direction to increase the distance between the neighboring third and fourth active fins 126 and 129. As shown in FIG. 13, the third and fourth bent portions 126b and 129b may be symmetric with respect to the first direction.

The fourth gate structure 136 may extend across the fourth straight line extension portion 129a of the fourth active fin 129. The fourth gate structure 136 may be substantially the same as or similar to that illustrated with reference to FIG. 12.

As described with reference to FIG. 7, the first, second, third and fourth epitaxial patterns may be formed at the first, second, third and fourth active fins 123, 124, 126 and 129 between the gate structures 130, 132, 134 and 136, respectively. As described with reference to FIG. 9, the first, second, third, fourth, fifth, sixth, seventh, eighth, ninth, tenth contact plugs 150, 152, 154, 156, 158, 160, 162, 164, 166 and 168 may be formed.

As described above, each of the first and second active fins 123 and 124 may have a wavy shape, so that the seventh distance d7 in a second direction between the first and second active fins 123 and 124 formed between the second gate structures 132 may increase. Each of the third and fourth active fins 126 and 129 may have a wavy shape, so that the eighth distance d8 in the second direction between the third and fourth active fins 126 and 129 formed between the third gate structures 134 may increase.

Figure 14:
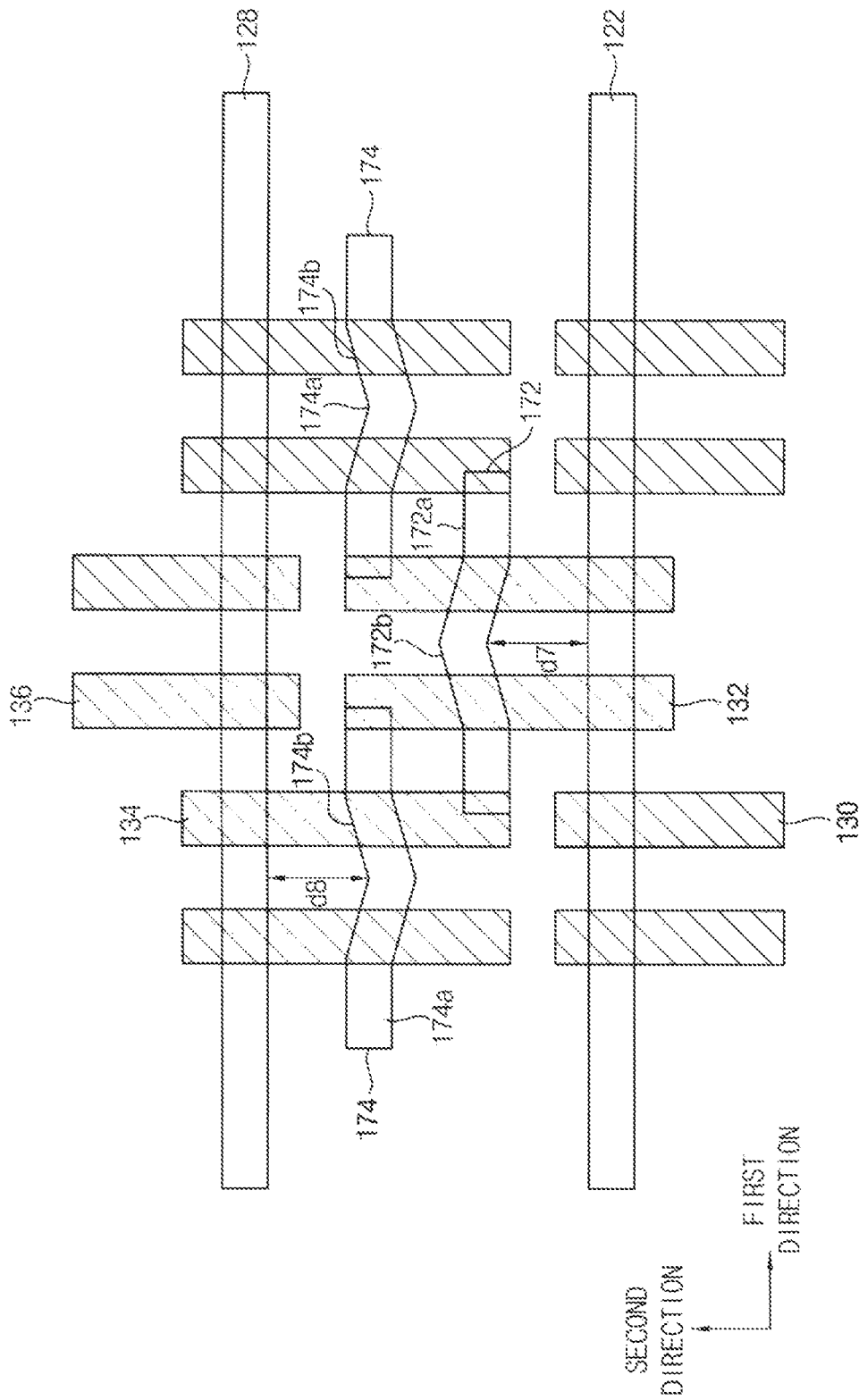
FIG. 14 is a plan view illustrating a layout of cells of an SRAM according to some embodiments of the inventive concepts.

FIG. 14 is a plan view illustrating a layout of cells of an SRAM according to some embodiments of the inventive concepts.

A unit cell in the SRAM may be substantially the same as or similar to the unit cell in the SRAM illustrated with reference to FIG. 10, except for the shapes of the second and third active fins.

Referring to FIG. 14, a unit cell in the SRAM may include the first active fin 122, a second active fin 172, a third active fin 174, the fourth active fin 128, the first gate structure 130, the second gate structure 132, the third gate structure 134 and the fourth gate structure 136.

The second active fin 172 in a second row may include second straight line extension portions 172a and a second bent portion 172b between the second straight line extension portions 172a. The second straight line extension portion 172a may extend in the second direction. Two connected second bent portions 172b may be formed between the second straight line extension portions 172a. Each of the second bent portions 172b may extend in an oblique direction with respect to the first direction.

In some embodiments, one of the second active fins 172 may include two second straight line extension portions 172a and two adjacent second bent portions 172b between the two the second straight line extension portions 172a. The two adjacent second bent portions 172b may be bent in a direction to be symmetric with each other, and each of the second bent portions 172b may contact an end of a respective second straight line extension portion 172a. Thus, a contact portion between the two adjacent second bent portions 172b may have a shape of a cusp. In other words, the contact portion between the two adjacent second bent portions 172b may be a pointed portion.

The contact portion of the second bent portions 172b may be between the second gate structures 132. Each of the second bent portions 172b may be bent to increase the distance between the neighboring first and second active fins 122 and 172. The second gate structure 172b may cross the second bent portion 172.

The third active fin 174 in a third row may include third straight line extension portions 174a and a third bent portion 174b between the third straight line extension portions 174a. A contact portion having a cusp shape of the third bent portions 174b may be between the third gate structures 134. The third active fin 174 may have a shape substantially the same as or similar to a shape of the second active fin 172. Each of the third bent portions 174b may be bent to increase the distance between the neighboring third and fourth active fins 174 and 128. The third gate structure 134 may cross the third bent portion 174b.

As described above, the second and third active fins 172 and 174 may have the second bent portion 172b and the third bent portion 174b, respectively. Thus, an electrical short between the epitaxial patterns may decrease.

Figure 15:
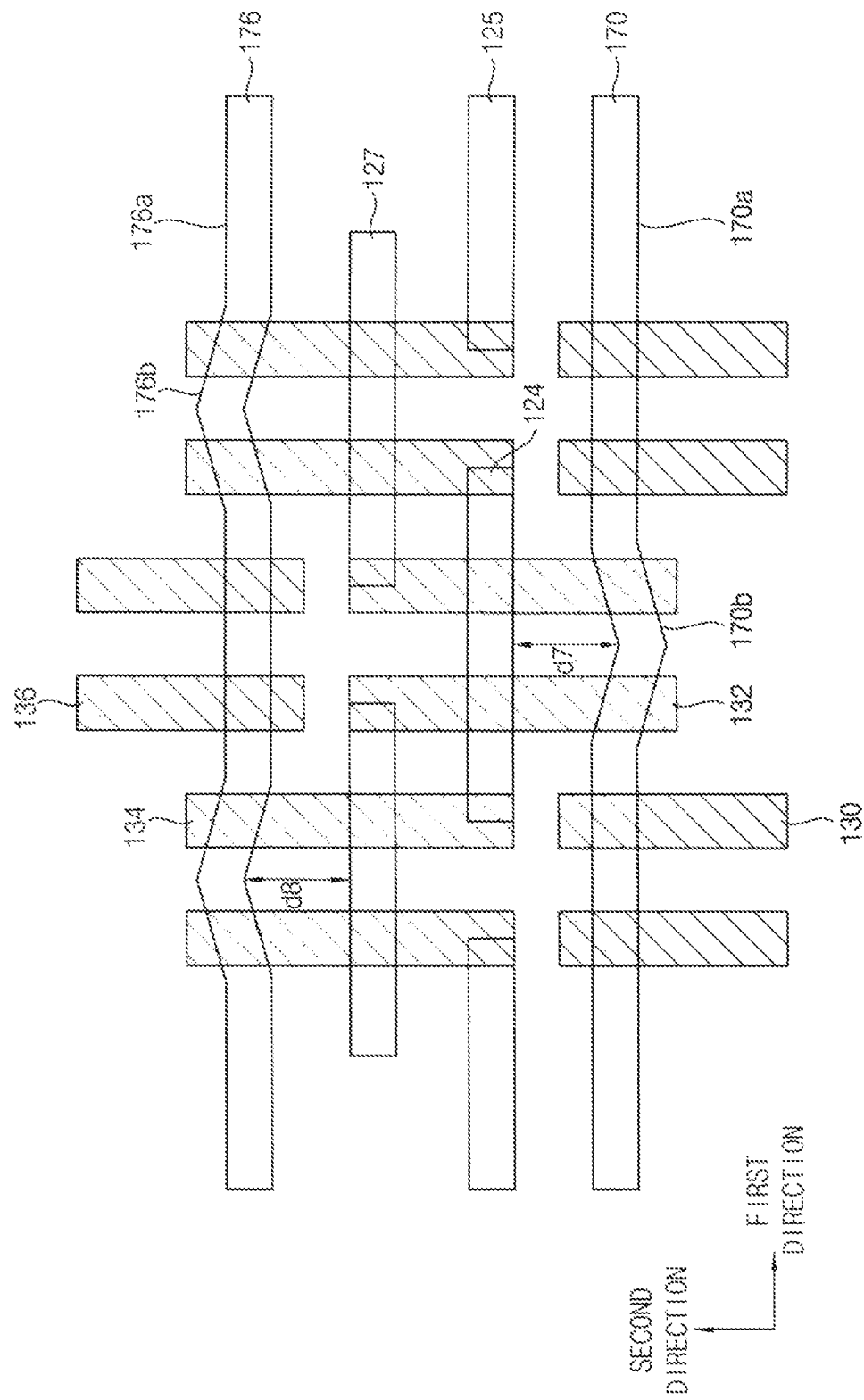
FIG. 15 is a plan view illustrating a layout of cells of an SRAM according to some embodiments of the inventive concepts.

FIG. 15 is a plan view illustrating a layout of cells of an SRAM according to some embodiments of the inventive concepts.

A unit cell in the SRAM may be substantially the same as or similar to the unit cell in the SRAM illustrated with reference to FIG. 12, except for the shapes of the first and fourth active fins.

Referring to FIG. 15, a unit cell in the SRAM may include a first active fin 170, the second active fin 125, the third active fin 127, a fourth active fin 176, the first gate structure 130, the second gate structure 132, the third gate structure 134 and the fourth gate structure 136.

The first active fin 170 in a first row may extend in the first direction, and may include first straight line extension portions 170a and a first bent portion 170b. In some embodiments, ends of two the first bent portions 170b may contact each other. Thus, a contact portion between the two the first bent portions 170b may have a shape of a cusp. The contact portion of the first bent portions 170b may be between the second gate structures 132. The first bent portion 170b may be bent in a direction to increase the distance between the neighboring first and second active fins 170 and 125. The second gate structure 132 may cross the first bent portion 170b.

The fourth active fin 176 in a fourth row may extend in the first direction, and may include fourth straight line extension portions 176a and a fourth bent portion 176b. The fourth active fin 176 may have a shape substantially the same as or similar to a shape of the first active fin 170. The fourth bent portion 176b may be bent in a direction to increase the distance between the neighboring third and fourth active fins 127 and 176. The third gate structure 134 may cross the fourth bent portion 176b.

As described above, the first and fourth active fins 170 and 176 may have the first bent portion 170b and the fourth bent portion 176b, respectively. Thus, an electrical short between the epitaxial patterns may decrease.

FIG. 16 is a plan view illustrating a layout of cells of an SRAM according to some embodiments of the inventive concepts.

Referring to FIG. 16, a unit cell in the SRAM may include the first active fin 170, the second active fin 172, the third active fin 174, the fourth active fin 176, the first gate structure 130, the second gate structure 132, the third gate structure 134 and the fourth gate structure 136.

The first active fin 170 in a first row and the fourth active fin 176 in a fourth row may be substantially the same as or similar to those illustrated with reference to FIG. 15.

The second active fin 172 in a second row and the third active fin 174 in a third row may be substantially the same as or similar to those illustrated with reference to FIG. 14.

The first, second, third and fourth active fins 170, 172, 174 and 176 may have the first, second, third and fourth bent portions 170b, 172b, 174b and 176b, respectively. Thus, an electrical short between the epitaxial patterns may decrease.

FIG. 17 is a plan view illustrating a layout of cells of the SRAM according to some embodiments of the inventive concepts.

Referring to FIG. 17, a unit cell in the SRAM may include a first active fin 180, the second active fin 125, the third active fin 127, a fourth active fin 182, the first gate structure 130, the second gate structure 132, the third gate structure 134 and the fourth gate structure 136.

The first active fin 180 in a first row and the fourth active fin 182 in a fourth row may extend in the first direction.

The second active fin 125 in a second row and the third active fin 127 in a third row may be substantially the same as or similar to those illustrated with reference to FIG. 6, respectively. That is, each of the first, second, third and fourth active fins 180, 125, 127 and 182 may have a straight line shape with no bent portions.

The first gate structure 190 may cross the first active fin 180. The first gate structure 190 may include first extension portions 190a extending in the second direction and a first bent portion 190b between the first extension portions 190a. The first bent portion 190b may be bent in an oblique direction with respect to the second direction. The first extension portion 190a may be perpendicular to the first active fin 180, and the first bent portion 190b may be overlapped with an isolation region between first active fins 180.

The second gate structure 192 may cross both of the first and second active fins 180 and 125. The second gate structure 192 may extend to the third active fin 127. The second gate structure 192 may include second extension portions 192a extending in the second direction and a second bent portion 192b between the second extension portions 192a.

The second extension portion 192a may be perpendicular to each of the first active fin 180 and the second active fin 125. The second bent portion 192b may be overlapped with an isolation region between first and second active fins 180 and 125.

The third gate structure 194 may cross both of the third and fourth active fins 127 and 182. The third gate structure 194 may extend to the second active fin 125. The third gate structure 194 may include third extension portions 194a extending in the second direction and a third bent portion 194b between the third extension portions 194a. The third bent portion 194b may be bent in an oblique direction with respect to the second direction.

The third extension portion 194a may be perpendicular to the third active fin 127 and the fourth active fin 182. The third bent portion 194b may be overlapped with an isolation region between third and fourth active fins 127 and 182.

The fourth gate structure 196 may cross the fourth active fin 182. The fourth gate structure 196 may include fourth extension portions 196a extending in the second direction and a fourth bent portion 196b between the fourth extension portions 196a. The fourth bent portion 196b may be bent in an oblique direction with respect to the second direction. The fourth extension portion 196a may be vertically overlapped with the fourth active fin 182, and the fourth bent portion 196b may be overlapped with an isolation region between fourth active fins 182.

Recesses may be formed on the first, second, third and fourth active fins 180, 125, 127 and 182 between the first to fourth gate structures 190, 192, 194 and 196. The first, second, third and fourth epitaxial patterns may fill the recesses, respectively.

First and second portions of the first and second active fins 180 and 125, respectively, between the second gate structures 192 may be shifted in respect to each other in the first direction. A length in the oblique direction between the first and second portions may increase. Thus, an electrical short between the first and second epitaxial patterns in the first and second portions may decrease.

Third and fourth portions of the third and fourth active fins 127 and 182, respectively, between the third gate structures 194 may be shifted in respect to each other in the first direction. A length in the oblique direction between the third and fourth portions may increase. Thus, an electrical short between the third and fourth epitaxial patterns in the third and fourth portions may decrease.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the inventive concepts have been particularly shown and described with reference to some embodiments thereof, those skilled in the art will readily appreciate that many modifications are possible without materially departing from the novel teachings and advantages of the present inventive concepts. Accordingly, all such modifications are intended to be included within the scope of the present inventive concepts. Therefore, it is to be understood that the foregoing is illustrative of some embodiments and is not to be construed as limited to the specific embodiments disclosed, and that modifications to the disclosed embodiments, as well as other embodiments, are intended to be included within the scope of the following claims.

What is claimed is:

1. A semiconductor device comprising:
   a substrate;
   a first fin on the substrate, and including a first portion, a second portion and a third portion, the second portion of the first fin being between the first portion of the first fin and the third portion of the first fin;
   a second fin on the substrate;
   a first isolation region on the substrate, and between the first fin and the second fin;
   a first gate on the first portion of the first fin and the first isolation region, wherein the first gate does not overlap the second fin;
   a second gate on the third portion of the first fin, the second fin and the first isolation region;
   a first epitaxial pattern on the first fin; and
   a second epitaxial pattern on the second fin,
   wherein the second fin is substantially straight, and is substantially parallel with the first portion of the first fin and the third portion of the first fin,
   wherein the first portion of the first fin is substantially parallel with the third portion of the first fin,
   wherein the first portion of the first fin is substantially perpendicular to the first gate,
   wherein the third portion of the first fin is substantially perpendicular to the second gate, and
   wherein the second portion of the first fin is obliquely inclined with respect to the first portion of the first fin and with respect to the third portion of the first fin.

2. The semiconductor device of claim 1, further comprising:
   a third fin on the substrate;
   a second isolation region on the substrate, and between the second fin and the third fin;
   a third gate on the third fin and the second isolation region; and
   a third epitaxial pattern on the third fin.

3. The semiconductor device of claim 2, further comprising:
   a fourth fin on the substrate, and including a first portion, a second portion and a third portion, the second portion of the fourth fin being between the first portion of the fourth fin and the third portion of the fourth fin;
   a third isolation region on the substrate, and between the third fin and the fourth fin;
   a fourth gate on the third portion of the fourth fin and the third isolation region; and
   a fourth epitaxial pattern on the fourth fin,
   wherein the third gate is on the third isolation region and the first portion of the fourth fin.

4. The semiconductor device of claim 3,
   wherein the third fin is substantially straight, and
      wherein the second portion of the fourth fin is obliquely inclined with respect to the first portion of the fourth fin and with respect to the third portion of the fourth fin.

5. The semiconductor device of claim 3,
   wherein N-type transistors are on the first fin and the fourth fin, and
   wherein P-type transistors are on the second fin and the third fin.

6. The semiconductor device of claim 1,
   wherein the first portion of the first fin and the second portion of the first fin form a first obtuse angle, and
   wherein the second portion of the first fin and the third portion of the first fin form a second obtuse angle.

7. The semiconductor device of claim 1, wherein a first end of the second portion of the first fin contacts the first gate, and a second end of the second portion of the first fin contacts the second gate.

8. A semiconductor device comprising:
   a substrate;
   a first fin on the substrate, and including a first portion, a second portion and a third portion, the second portion of the first fin being between the first portion of the first fin and the third portion of the first fin;
   a second fin on the substrate;
   a third fin on the substrate;
   a fourth fin on the substrate, and including a first portion, a second portion and a third portion, the second portion of the fourth fin being between the first portion of the fourth fin and the third portion of the fourth fin;
   a first isolation region on the substrate, and between the first fin and the second fin;
   a second isolation region on the substrate, and between the second fin and the third fin;
   a third isolation region on the substrate, and between the third fin and the fourth fin;
   a first gate on the first portion of the first fin and the first isolation region;
   a second gate on the third portion of the first fin, the second fin, and the first isolation region;
   a third gate on the third fin, the first portion of the fourth fin, and the third isolation region;
   a fourth gate on the third portion of the fourth fin and the third isolation region;
   a first epitaxial pattern on the first fin;
   a second epitaxial pattern on the second fin;
   a third epitaxial pattern on the third fin; and
   a fourth epitaxial pattern on the fourth fin,
   wherein the second fin is substantially straight,
   wherein the third fin is substantially straight,
   wherein the first portion of the first fin is substantially parallel with the third portion of the first fin, and substantially parallel with the second fin and the third fin,
   wherein the first portion of the fourth fin is substantially parallel with the third portion of the fourth fin, and substantially parallel with the second fin and the third fin,
   wherein the first portion of the first fin is substantially perpendicular to the first gate, wherein the third portion of the first fin is substantially perpendicular to the second gate,
wherein the first portion of the fourth fin is substantially perpendicular to the third gate,
wherein the third portion of the fourth fin is substantially perpendicular to the fourth gate,
wherein the second portion of the first fin is obliquely inclined with respect to the first portion of the first fin and with respect to the third portion of the first fin,
wherein the second portion of the fourth fin is obliquely inclined with respect to the first portion of the fourth fin and with respect to the third portion of the fourth fin,
wherein the first gate on the first fin is a gate of a first pass transistor, wherein a first portion of the second gate on the first fin is a gate of a first pull-down transistor,
wherein a second portion of the second gate on the second fin is a gate of a first pull-up transistor,
wherein a first portion of the third gate on the third fin is a gate of a second pull-up transistor,
wherein a second portion of the third gate on the fourth fin is a gate of a second pull-down transistor, and
wherein the fourth gate on the fourth fin is a gate of a second pass transistor.

9. The semiconductor device of claim 8,
wherein a first end of the second portion of the first fin contacts the first gate, and a second end of the second portion of the first fin contacts the second gate, and
wherein a first end of the second portion of the fourth fin contacts the third gate, and a second end of the second portion of the fourth fin contacts the fourth gate.

10. The semiconductor device of claim 8,
wherein no gate is on the second portion of the first fin, and
wherein no gate is on the second portion of the fourth fin.

11. The semiconductor device of claim 8, further comprising:
a first insulating interlayer on the first isolation region;
a second insulating interlayer on the second isolation region; and
a third insulating interlayer on the third isolation region,
wherein a portion of the first insulating interlayer is between the first gate and the third gate, and
wherein a portion of the third insulating interlayer is between the second gate and the fourth gate.

12. The semiconductor device of claim 8,
wherein the first portion of the first fin and the second portion of the first fin form a first obtuse angle,
wherein the second portion of the first fin and the third portion of the first fin form a second obtuse angle,
wherein the first portion of the fourth fin and the second portion of the fourth fin form a third obtuse angle, and
wherein the second portion of the fourth fin and the third portion of the fourth fin form a fourth obtuse angle.

13. The semiconductor device of claim 8,
wherein each of the first epitaxial pattern and the fourth epitaxial pattern comprises N-type impurities, and
wherein each of the second epitaxial pattern and the third epitaxial pattern comprises P-type impurities.

14. The semiconductor device of claim 8,
wherein only one of the first gate or the third gate contacts the second fin, and
wherein only one of the second gate or the fourth gate contacts the third fin.

15. The semiconductor device of claim 8,
wherein the second portion of the first fin is substantially parallel with the second portion of the fourth fin,
wherein the first gate and the third gate are colinear in a first straight line, and
wherein the second gate and the fourth gate are colinear in a second straight line.

16. The semiconductor device of claim 1,
wherein the third portion of the first fin is closer than the first portion of the first fin to the second active fin.

17. A semiconductor device comprising:
a substrate;
a first fin on the substrate, and including a first portion, a second portion and a third portion, the second portion of the first fin being between the first portion of the first fin and the third portion of the first fin;
a second fin on the substrate;
a third fin on the substrate;
a fourth fin on the substrate, and including a first portion, a second portion and a third portion, the second portion of the fourth fin being between the first portion of the fourth fin and the third portion of the fourth fin;
a first isolation region on the substrate, and between the first fin and the second fin;
a second isolation region on the substrate, and between the second fin and the third fin;
a third isolation region on the substrate, and between the third fin and the fourth fin;
a first gate on the first portion of the first fin and the first isolation region;
a second gate on the third portion of the first fin, the second fin, and the first isolation region;
a third gate on the third fin, the first portion of the fourth fin, and the third isolation region;
a fourth gate on the third portion of the fourth fin and the third isolation region;
a first epitaxial pattern on the first fin;
a second epitaxial pattern on the second fin;
a third epitaxial pattern on the third fin; and
a fourth epitaxial pattern on the fourth fin,
wherein the second fin is substantially straight,
wherein the third fin is substantially straight,
wherein the first portion of the first fin is substantially parallel with the third portion of the first fin, and substantially parallel with the second fin and the third fin,
wherein the first portion of the fourth fin is substantially parallel with the third portion of the fourth fin, and substantially parallel with the second fin and the third fin,
wherein the first portion of the first fin is substantially perpendicular to the first gate,
wherein the third portion of the first fin is substantially perpendicular to the second gate,
wherein the first portion of the fourth fin is substantially perpendicular to the third gate,
wherein the third portion of the fourth fin is substantially perpendicular to the fourth gate,
wherein the second portion of the first fin is obliquely inclined with respect to the first portion of the first fin and with respect to the third portion of the first fin,
wherein the second portion of the fourth fin is obliquely inclined with respect to the first portion of the fourth fin and with respect to the third portion of the fourth fin,
wherein the second portion of the first fin is substantially parallel with the second portion of the fourth fin,
wherein the first gate and the third gate are colinear in a first straight line,
wherein the second gate and the fourth gate are colinear in a second straight line, wherein the first gate does not contact the second fin, and
wherein the fourth gate does not contact the third fin.

18. The semiconductor device of claim 17, wherein the first gate contacts a bent region where the first portion of the first fin and the second portion of the first fin converge.

19. The semiconductor device of claim 17, wherein the semiconductor device is an SRAM device.

20. The semiconductor device of claim 17,
wherein the first portion of the first fin and the second portion of the first fin form a first obtuse angle,
wherein the second portion of the first fin and the third portion of the first fin form a second obtuse angle,
wherein the first portion of the fourth fin and the second portion of the fourth fin form a third obtuse angle, and
wherein the second portion of the fourth fin and the third portion of the fourth fin form a fourth obtuse angle.

* * * * *